(12) United States Patent
Koh et al.

(10) Patent No.: US 12,239,008 B2
(45) Date of Patent: Feb. 25, 2025

(54) CARBON NANOTUBE MONOLAYER FILM, METHOD OF PREPARING THE SAME, AND ELECTRONIC DEVICE INCLUDING THE SAME

(71) Applicant: Samsung Electronics Co., Ltd., Suwon-si (KR)

(72) Inventors: Haengdeog Koh, Hwaseong-si (KR); Hajin Kim, Hwaseong-si (KR); Moonil Jung, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 475 days.

(21) Appl. No.: 17/471,474

(22) Filed: Sep. 10, 2021

(65) Prior Publication Data
US 2022/0352470 A1    Nov. 3, 2022

(30) Foreign Application Priority Data
Apr. 23, 2021    (KR) .................. 10-2021-0053103

(51) Int. Cl.
*H10K 85/20*    (2023.01)
*C01B 32/16*    (2017.01)
(Continued)

(52) U.S. Cl.
CPC ........... *H10K 85/221* (2023.02); *C01B 32/16* (2017.08); *H01L 29/0669* (2013.01); *H10K 10/462* (2023.02)

(58) Field of Classification Search
CPC ... H01L 21/02606; Y10S 977/842–848; Y10S 977/742–752; H10K 85/211;
(Continued)

(56) References Cited

U.S. PATENT DOCUMENTS 8,394,727 B1 *  3/2013  Afzali-Ardakani .... B82Y 10/00
                                                    438/82
8,545,790 B2   10/2013  Konesky
(Continued)

FOREIGN PATENT DOCUMENTS

CN    104743539 A      7/2015
CN    111056526 A  *  4/2020  .............. B81B 7/04
(Continued)

OTHER PUBLICATIONS

Dichloromethane, 2024, Royal Society of Chemistry, All Pages (Year: 2024).*
(Continued)

*Primary Examiner* — Fernando L Toledo
*Assistant Examiner* — Marshall Mu-Nuo Hatfield
(74) *Attorney, Agent, or Firm* — Harness, Dickey & Pierce, P.L.C.

(57) ABSTRACT

A method of preparing a carbon nanotube monolayer film includes applying a bifunctional hydrogen-bond linker onto a substrate to prepare a surface-treated substrate, mixing carbon nanotubes having a heteroatom-containing aromatic polymer coating film with a hydrophobic solvent to obtain a composition and contacting the surface-treated substrate with the composition, and heat-treating the surface-treated substrate contacting the composition.

18 Claims, 16 Drawing Sheets

(51) Int. Cl.
　　　*H01L 29/06*　　　(2006.01)
　　　*H10K 10/46*　　　(2023.01)
(58) Field of Classification Search
　　　CPC ........... H10K 85/221–225; C01B 32/158–178;
　　　　　　　　C01B 2202/00–36; H01J 2329/0455;
　　　　　　　　H01J 2201/30434; H01J 2201/30469
　　　See application file for complete search history.

(56) References Cited

U.S. PATENT DOCUMENTS

| | | | |
|---|---|---|---|
| 9,493,644 B2 | 11/2016 | Yoo et al. | |
| 9,505,615 B2 | 11/2016 | Misra et al. | |
| 9,884,827 B2 | 2/2018 | Afzali-Ardakani et al. | |
| 10,035,902 B2 | 7/2018 | Ryu et al. | |
| 2005/0022726 A1* | 2/2005 | Wong | B82Y 40/00 117/105 |
| 2007/0145335 A1* | 6/2007 | Anazawa | H01B 1/04 252/500 |
| 2008/0102213 A1* | 5/2008 | Afzali-Ardakani | C01B 32/174 427/378 |
| 2011/0250451 A1* | 10/2011 | Heintz | B05D 3/0493 428/401 |
| 2015/0298164 A1* | 10/2015 | Pasquali | B05D 1/18 428/221 |
| 2016/0340521 A1* | 11/2016 | Yoshiwara | C09D 133/08 |
| 2017/0012228 A1* | 1/2017 | Arnold | C01B 32/168 |
| 2018/0305212 A1* | 10/2018 | Huynh | D02J 1/04 |
| 2019/0002286 A1* | 1/2019 | Wang | C08K 3/041 |
| 2019/0010342 A1* | 1/2019 | Ding | C09D 11/03 |
| 2020/0239315 A1* | 7/2020 | Kim | B01J 37/0219 |
| 2020/0255292 A1* | 8/2020 | Li | C01B 32/159 |

FOREIGN PATENT DOCUMENTS

| | | |
|---|---|---|
| JP | 5889416 B2 | 3/2016 |
| KR | 10-2006-0092737 A | 8/2006 |
| KR | 10-2011-0044360 A | 4/2011 |
| WO | WO-2011/149298 A2 | 12/2011 |
| WO | WO-2013/077696 A1 | 5/2013 |

OTHER PUBLICATIONS

Cis-2-Butene-1,4-diol, 2024, Royal Society of Chemistry, All Pages (Year: 2024).*
1,4-Butanediol, 2024, Royal Society of Chemistry, All Pages (Year: 2024).*
Typical Values of Surface Energy for Materials and Adhesives, 1987, The Welding Institute, All Pages (Year: 1987).*
J. Brandrup, E.H. Immergut, E.A. Grulke, 1999, John Wiley and Sons, Inc. , 689-711 (Year: 1999).*
Chou, A., et al., "Self-Assembled Carbon Nanotube Electrode Arrays: Effect of Length of the Linker between Nanotubes and Electrode, " J. Phys. Chem. C, vol. 113, No. 8, pp. 3203-3211, 2009, American Chemical Society.
Han, J., et al., "Hydrogen-Bond-Driven Assembly of Thin Multiwalled Carbon Nanotubes, " J. Phys. Chem. C, vol. 112, No. 41, pp. 15961-15965, 2008, American Chemical Society.
White, J., et al., "The Specification of Orientation and its Development in Polymer Processing," Polymer Engineering and Science, Mid-Apr. 1983, vol. 23, No. 5, https://onlinelibrary.wiley.com/doi/abs/10.1002/pen.760230503.
Koh, H., et al., "Directed Self-Assembly on Photo-Crosslinked Polystyrene Sub-Layers: Nanopattern Uniformity and Orientation," Materials, 2016, 9, 648, doi: 10.3390/ma9080648.
Tans, S., et al., "Room-temperature transistor based on a single carbon nanotube," Nature, vol. 393, pp. 49-52, 1998.
Si, J., et al., Scalable Preparation of High-Density Semiconducting Carbon Nanotube Arrays for High Performance Field-Effect Transistors, ACS Nano 2018, 12, pp., 627-634, American Chemical Society.
Wu, J., et al., "Short-Channel Effects in Tunnel FETs," IEEE Transactions on Electron Devices, 2015.
Franklin, A., "The road to carbon nanotube transistors," Nature, vol. 498, pp. 443-444, 2013, Macmillan Publishers Limited.
Cao, Q et al., "Carbon nanotube transistors scaled to a 40-nanometer footprint," Science, 356, pp. 1369-1372, 2017.
Han, S., et al., "High-speed integrated circuits with solution-processed self-assembled carbon nanotubes," Nature Nanotechnology, 12, 2017, Macmillan Publishers Limited.
Jin, S., et al., "Using nanoscale thermocapillary flows to create arrays of purely semiconducting single-walled carbon nanotubes," Nature Nanotechnology, 8, 2013, Macmillan Publishers Limited.
Wang, C., et al., "Synthesis and Device Applications of High-Density Aligned Carbon Nanotubes Using Low-Pressure Chemical Vapor Deposition and Stacked Multiple Transfer," Nano Research, 3(12), pp. 831-842, 2010.
Shulaker, M., et al., "Linear Increases in Carbon Nanotube Density Through Multiple Transfer Technique," Nano Letters, 11, pp. 1881-1886, 2011, American Chemical Society.
Shulaker, M., et al., "High-Performance Carbon Nanotube Field-Effect Transistors," IEEE International Electron Devices Meeting, pp. 33.6.1-33.6.4.
Lee, D., et al., "Three-Dimensional Fin-Structured Semiconducting Carbon Nanotube Network Transistor," ACS Nano, 10, pp. 10894-10900, 2016.
Brady, G., et al., "Quasi-ballistic carbon nanotube array transistors with current density exceeding Si and GaAs," Science Advances, 2, e1601240, 2016.
He, X., et al., "Wafer-scale monodomain films of spontaneously aligned single-walled carbon nanotubes," Nature Nanotechnology, vol. 11, pp. 633-638, 2016.
Hills, G., "Modern Microprocessor built from complementary carbon nanotube transistors, " Nature, vol. 572, 2019.
Park, S., et al., "Large-Area Assembly of Densely Aligned Single-Walled Carbon Nanotubes Using Solution Shearing and Their Application to Field-Effect Transistors," Advanced Materials, 27, pp. 2656-2662, 2015, Wiley-VCH Verlag Gmbh & Co., KGaA, Weinheim.
Park, H., et al., "High-density integration of carbon nanotubes via chemical self-assembly," Nature Nanotechnology, vol. 7, pp. 787-791, 2012.
Hong, S., "Improved Density in Aligned Arrays of Single-Walled Carbon Nanotubes by Sequential Chemical Vapor Deposition on Quartz," Advanced Materials, 22, pp. 1826-1830, 2010, WILEY-VCH Verlang GmbH & Co. KGaA, Weinheim.
Cao, Q., "Arrays of single-walled carbon nanotubes with full surface coverage for high-performance electronics," Nature Nanotechnology, vol. 8, pp. 180-186, 2013, Macmillan Publishers Limited.
Liu, L., et al., "Aligned, high-density semiconducting carbon nanotube arrays for high-performance electronics," Science, 368, pp. 850-856, 2020.
McKay, D., et al., "High-Contrast Qubit Interactions Using Multimode Cavity QED," Physical Review Letters, 114, pp. 180501-1-180501-5, 2015, American Physical Society.
Patil, N., et al., "Circuit-Level Performance Benchmarking and Scalability Analysis of Carbon Nanotube Transistor Circuits," IEEE Transactions on Nanotechnology, vol. 8, No. 1, pp. 37-45, 2009.
Engel, M., et al., "Thin Film Nanotube Transistors Based on Self-Assembled, Aligned, Semiconducting Carbon Nanotube Arrays," ACS Nano, vol. 2, No. 12, pp. 2445-2452, 2008.
Cao, Y., et al., "Radio Frequency Transistors Using Aligned Semiconducting Carbon Nanotubes with Current-Gain Cutoff Frequency and Maximum Oscillation Frequency Simultaneously Greater than 70 GHz," ACS Nano, 10, pp. 6782-6790, 2016, American Chemical Society.
Numata, M., "Creation of Hierarchical Carbon Nanotube Assemblies through Alternative Packing of Complementary Semi-Artificial b-1, 3-Glucan/Carbon Nanotube Composites," Chem. Eur. J., 14, pp. 2398-2404, 2008, Wiley-VCH Verlag Gmbh & Co., KGaA, Weinheim.

(56) References Cited

OTHER PUBLICATIONS

Perebeinos, V., et al., "Wetting Transition for Carbon Nanotube Arrays under Metal Contacts" Physical Review Letters, 114, pp. 185501-1-185501-4, 2015, American Physical Society.

* cited by examiner

CARBON NANOTUBE MONOLAYER FILM, METHOD OF PREPARING THE SAME, AND ELECTRONIC DEVICE INCLUDING THE SAME

CROSS-REFERENCE TO RELATED APPLICATION

This application is based on and claims priority under 35 U.S.C. § 119 to Korean Patent Application No. 10-2021-0053103, filed on Apr. 23, 2021, in the Korean Intellectual Property Office, the disclosure of which is incorporated by reference herein in its entirety.

BACKGROUND

1. Field

The present inventive concepts relate to carbon nanotube monolayer films, methods of preparing the same, and electronic devices including the same.

2. Description of the Related Art

Since carbon nanotubes (CNTs) enable ballistic or near-ballistic transfer of electrons with a low bias voltage, research has been carried out on CNT-field-effect transistors (FETs) in which these CNTs are used as a current path between a source and a drain on a substrate of a semiconductor device.

However, in the CNT-FETs developed so far, there is a lack of arrangement of a large number of CNTs in parallel at sufficiently small intervals, and thus there is a requirement to increase the density of CNTs and improve the irregular intervals between CNTs.

SUMMARY

Provided are methods of preparing a carbon nanotube (CNT) monolayer film.

Provided are carbon nanotube (CNT) monolayer films prepared according to the preparation methods.

Provided are electronic devices including the carbon nanotube (CNT) monolayer films.

Additional aspects will be set forth in part in the description which follows and, in part, will be apparent from the description, or may be learned by practice of example embodiments of the inventive concepts.

According to some example embodiments of the inventive concepts, a method of preparing a carbon nanotube monolayer film may include: applying a bifunctional hydrogen-bond linker onto a substrate to prepare a surface-treated substrate; mixing carbon nanotubes having a heteroatom-containing aromatic polymer coating film with a hydrophobic solvent to obtain a composition and contacting the surface-treated substrate with the composition; and heat-treating the surface-treated substrate contacting the composition.

The bifunctional hydrogen-bond linker may include at least one of a diol-based compound, a dicarboxylic acid-based compound, or a disulfonic acid-based compound.

A difference in solubility parameter between the bifunctional hydrogen-bond linker and the hydrophobic solvent may be about 3 $MPa^{1/2}$ to about 30 $MPa^{1/2}$.

A difference in surface energy between the substrate and the bifunctional hydrogen-bond linker may be about 1 mN/m to about 15 mN/m, and a difference in surface energy between the bifunctional hydrogen-bond linker and the hydrophobic solvent may be about 3 mN/m to about 20 mN/m.

The bifunctional hydrogen-bond linker may have a solubility parameter of about 35 $MPa^{1/2}$ to about 50 $MPa^{1/2}$ and may have a surface energy of about 35 mN/m to about 55 mN/m.

The hydrophobic solvent may have a solubility parameter of about 14 $MPa^{1/2}$ to about 20 $MPa^{1/2}$ and may have a surface energy of about 25 mN/m to about 32 mN/m.

The bifunctional hydrogen-bond linker may be 2-butene-1,4-diol, 1,3-propane-diol, 1,4-butanediol, 2-butyne-1,4-diol, 1,2-dodecanediol, 1,2-hexadecanediol, 1,9-nonanediol, oxalic acid, malonic acid, succinic acid, glutaric acid, adipic acid, pimelic acid, suberic acid, azelaic acid, 1,2-ethane-disulfonic acid, or a combination thereof. The hydrophobic solvent may be chloroform, dichloromethane, N,N-dimethylformamide, benzene, dichlorobenzene, toluene, xylene, or a combination thereof.

The substrate may have a surface energy of about 39 mN/m to about 45 mN/m. The surface energy of the substrate may be higher than a surface energy of the bifunctional hydrogen-bond linker.

The heteroatom-containing aromatic polymer coating film may have a heteroatom-containing aromatic polymer that is a copolymer including a conjugated aromatic first repeating unit and a heteroatom-containing aromatic second repeating unit. The conjugated aromatic first repeating unit may be benzene, naphthalene, anthracene, fluorene, phenylene, furan, benzofuran, isobenzofuran, pyrrole, indole, isoindole, thiophene, bithiophene, benzothiophene, benzo[c]thiophene, imidazole, benzimidazole, purine, pyrazole, indazole, oxazole, benzoxazole, isoxazole, benzisoxazole, thiazole, benzothiazole, pyridine, bipyridine, quinolone, isoquinoline, pyrazine, quinoxaline, acridine, pyrimidine, quinazoline, pyridazine, cinnoline, phthalazine, tetrazine, triazine, benzothiadiazole, or a combination thereof. The heteroatom-containing aromatic second repeating unit is 2,5-thiophene, 2,5-pyridine, 2,6-pyridine, 2,5-furan, 2,5-pyrrole, or a combination thereof.

The conjugated aromatic first repeating unit may be 2,7-fluorene, 9,9-dioctylfluorenyl-2,7-diyl, 2,5-thiophene, 6,6'-(2,2'-bipyridine}, or a combination thereof. The heteroatom-containing aromatic second repeating unit may be different from the conjugated aromatic first repeating unit.

The copolymer may be poly[(9,9-dioctylfluorenyl-2,7-diyl)-alt-co-(6,6'-{2,2'-bipyridine})].

The heat-treating of the surface-treated substrate may be performed at about 60° C. to about 200° C.

The contacting the surface-treated substrate with the composition may be performed at a coating speed of about 0.1 mm/min to about 50 mm/min.

In the composition, a content of carbon nanotubes surface-coated with a heteroatom-containing aromatic polymer may be about 1 µg/ml to about 200 µg/ml.

The method may further include performing a showering process using a benzene-based solvent after the heat-treating of the surface-treated substrate.

According to some example embodiments, a carbon nanotube monolayer film prepared by the method of preparing a carbon nanotube monolayer film may include a plurality of carbon nanotube composites and a plurality of bifunctional hydrogen-bond linkers. Each of the carbon nanotube composites may include carbon nanotubes and a heteroatom-containing aromatic polymer coating film on surfaces of the carbon nanotubes. The plurality of carbon nanotube composites may be bonded to each other through hydrogen bonds by the bifunctional hydrogen-bond linkers.

A density of carbon nanotubes in the carbon nanotube monolayer film may be about 60 ea/μm to about 350 ea/μm.

An f-factor in the carbon nanotube monolayer film may be about 0.4 to about 0.8.

The carbon nanotube monolayer film may have a thickness of about 0.5 nm to about 10 nm.

According to some example embodiments of the inventive concepts, a carbon nanotube monolayer film may include a plurality of carbon nanotube composites and a plurality of bifunctional hydrogen-bond linkers. Each of the carbon nanotube composites may include carbon nanotubes and a heteroatom-containing aromatic polymer coating film on surfaces thereof. The plurality of carbon nanotube composites may be bonded to each other through hydrogen bonds by the bifunctional hydrogen-bond linkers. A density of the carbon nanotubes in the carbon nanotube monolayer film may be about 60 ea/μm to about 350 ea/μm.

The carbon nanotube monolayer film may have a thickness of about 0.5 nm to about 10 nm.

An f-factor in the carbon nanotube monolayer film may be about 0.4 to about 0.8.

According to some example embodiments of the inventive concepts, an electronic device may include the carbon nanotube monolayer film.

The electronic device may be a field-effect transistor, a chemical/biosensor, or a near-infrared (NIR) photodetector.

According to some example embodiments of the inventive concepts, a field-effect transistor may include a substrate, source and drain electrodes spaced apart from each other on the substrate, a carbon nanotube monolayer film according to any of the example embodiments that is electrically connected to the source and drain electrodes, a gate electrode, and a gate insulating layer.

According to some example embodiments of the inventive concepts, a carbon nanotube monolayer film may include carbon nanotubes having a density in the carbon nanotube monolayer film of about 100 ea/μm to about 350 ea/μm.

An f-factor in the carbon nanotube monolayer film may be about 0.4 to about 0.8.

According to some example embodiments of the inventive concepts, an electronic device may include the carbon nanotube monolayer film according to any of the example embodiments.

BRIEF DESCRIPTION OF THE DRAWINGS

The above and other aspects, features, and advantages of certain example embodiments of the inventive concepts will be more apparent from the following description taken in conjunction with the accompanying drawings, in which.

DETAILED DESCRIPTION

Figure 1:
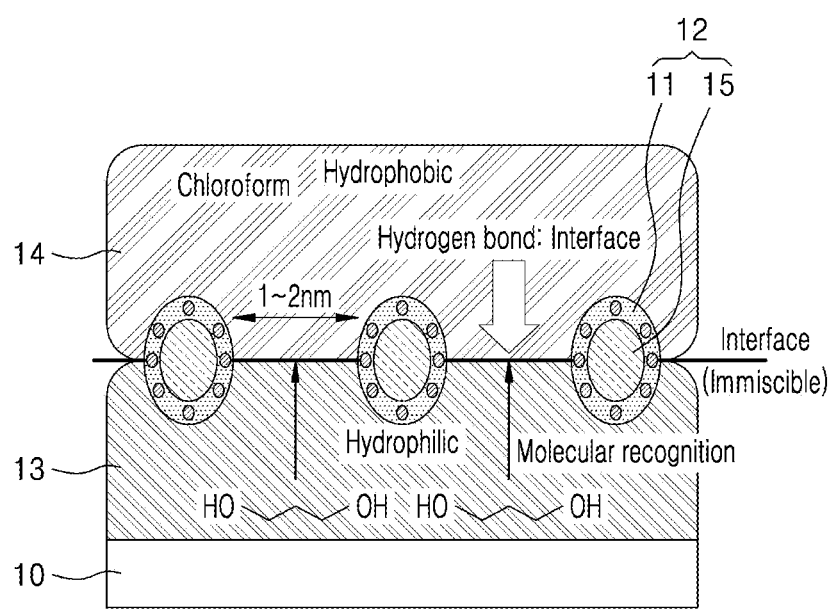
FIG. 1 illustrates a structure in which a carbon nanotube (CNT) monolayer film is formed on a substrate according to some example embodiments.

Reference will now be made in detail to some example embodiments, some of which are illustrated in the accompanying drawings, wherein like reference numerals refer to like elements throughout. In this regard, some example embodiments may have different forms and should not be construed as being limited to the descriptions set forth herein. Accordingly, some example embodiments are merely described below, by referring to the figures, to explain aspects of the inventive concepts. As used herein, the term "and/or" includes any and all combinations of one or more of the associated listed items. Expressions such as "at least one of," when preceding a list of elements, modify the entire list of elements and do not modify the individual elements of the list.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Hereinafter, carbon nanotube monolayer films according to some example embodiments, preparation methods thereof according to some example embodiments, and electronic devices including the same according to some example embodiments will be described in more detail.

According to some example embodiments, there is provided a method of preparing a carbon nanotube monolayer film, the method including: applying a bifunctional hydrogen-bond linker onto a substrate to prepare a surface-treated substrate; mixing carbon nanotubes having a heteroatom-containing aromatic polymer coating film with a hydrophobic solvent to obtain a composition and contacting the surface-treated substrate with the composition; and heat-treating the surface-treated substrate contacting the composition.

In a field-effect transistor (CNT-FET) including a general carbon nanotube (CNT) film, carbon nanotubes (CNTs) are aligned by mechanical self-assembly between CNT and CNT. In this case, it takes a lot of time to coat the CNT film, and CNT-CNT interaction is due to van-der waals interaction, that is, π-π stacking interaction or hydrophobic interaction to decrease the interaction force between CNT and CNT, and thus the distance between CNT and CNT greatly increases to 10 nm or more during CNT-CNT packing, so the average density of the CNT film did not reach a satisfactory level. Further, since CNTs are irregularly arranged in the CNT film, there are various limitations in improving the performance of a CNT-FET circuit, and the electrical characteristics thereof are insufficient, so improvement is required.

Thus, in order to solve the above problems, the present inventors have completed the present inventive concepts for a method of preparing a CNT film capable of improving the alignment degree of CNTs by regularly arranging CNTs while increasing the density of the CNT film by reducing the distance between CNT and CNT.

In the method of preparing a CNT single film according to some example embodiments, a bifunctional hydrogen-bond linker is applied onto a substrate to prepare a surface-treated substrate, and this substrate contacts a composition in which CNTs are dispersed in a hydrophobic solvent. As a result, hydrophilic and hydrophobic interfaces having immiscibility are formed, and hydrogen bonding-induced CNT assembly proceeds through hydrogen bonding surface reaction, thereby manufacturing a CNT film having high density and regular arrangement. Here, immiscibility refers to a property by which the hydrophilic and hydrophobic interfaces do not mix with each other.

A method of preparing a CNT film according to some example embodiments will be described in more detail as follows.

First, a bifunctional hydrogen-bond linker is applied onto the surface of a substrate to obtain a surface-treated substrate. The bifunctional hydrogen-bond linker has hydrophilicity.

The bifunctional hydrogen-bond linker is a compound having two functional groups capable of hydrogen bonding. When this compound is brought into contact with carbon nanotubes each having a heteroatom-containing aromatic polymer coating film, the functional group capable of hydrogen bonding of the bifunctional hydrogen-bond linker forms a hydrogen bond with the heteroatom of the heteroatom-containing aromatic polymer.

The bifunctional hydrogen-bond linker includes at least one of a diol-based compound, a dicarboxylic acid-based compound, or a disulfonic acid-based compound.

Separately, carbon nanotubes each having a heteroatom-containing aromatic polymer coating film (hereinafter referred to as "carbon nanotube complex") are mixed with a hydrophobic solvent to obtain a composition. The content of carbon nanotubes surface-coated with a heteroatom-containing aromatic polymer coating film, that is, CNT composites in the composition is about 1 μg/ml to about 200 μg/ml, about 3 μg/ml to about 150 μg/ml, about 4 μg/ml to about 100 μg/ml, or about 5 μg/ml to about 50 μg/ml. For example, in the composition, a content of carbon nanotubes surface-coated with a heteroatom-containing aromatic polymer may be about 1 μg/ml to about 200 μg/ml, about 3 μg/ml to about 150 μg/ml, about 4 μg/ml to about 100 μg/ml, or about 5 μg/ml to about 50 μg/ml. A process of contacting this composition with the surface-treated substrate obtained according to the above procedure is performed (refer to FIG. 2). The process of contacting the composition with the surface-treated substrate may be performed by dip coating, spray coating, spin coating, or the like.

Figure 2:
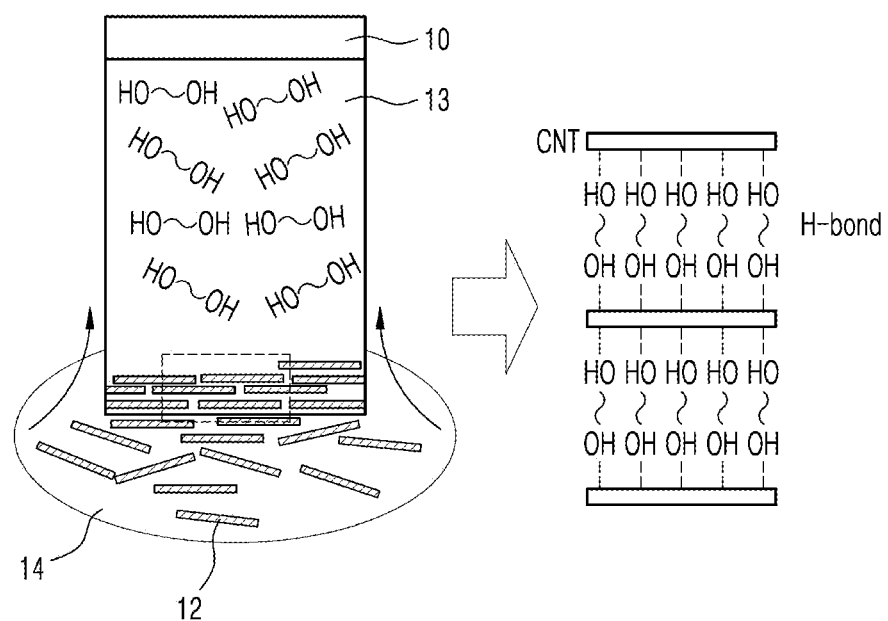
FIG. 2 illustrates a process of preparing the structure of FIG. 1 according to some example embodiments.

Referring to FIG. 2, CNT-CNT packing and alignment occurs through hydrogen bonding-induced CNT assembly at the hydrophobic interface dispersing the bifunctional hydrogen bonding linker 13 and CNTs, thereby improving CNT packing density and alignment degree.

The carbon nanotubes have semiconducting and metallic properties, are selected from single-walled carbon nanotubes (SWCNTs or SWNTs), multi-walled carbon nanotubes (MWCNTs or MWNTs), and 2 to 30-walled, for example, 3 to 15-walled carbon nanotubes. Further, the carbon nanotubes (CNTs) have an average inner diameter of about 0.4 nm to about 50 nm, about 1 nm to about 10 nm, or about 2 nm to about 6 nm.

The carbon nanotube (CNT) according to some example embodiments has a diameter of about 0.5 nm to about 3 nm and a length of about 300 nm to 3 μm.

As the carbon nanotubes (CNT), semiconducting single-walled carbon nanotubes, each having structure in which a heteroatom-containing aromatic polymer coating film containing a conjugated aromatic polymer is formed on the surface thereof, is used. Here, the heteroatom is at least one of nitrogen, sulfur, or oxygen, and has a non-covalent electron pair.

According to some example embodiments, the heteroatom-containing aromatic polymer coating film may include a heteroatom-containing aromatic polymer that may be a copolymer including a conjugated aromatic first repeating unit (also referred to herein as a "first repeating unit") and a heteroatom-containing aromatic second repeating unit (also referred to herein as a "second repeating unit"). The heteroatom may be at least one of nitrogen, oxygen, or sulfur.

The first repeating unit is benzene, naphthalene, anthracene, fluorene, phenylene, furan, benzofuran, isobenzofuran, pyrrole, indole, isoindole, thiophene, bithiophene, benzothiophene, benzo[c]thiophene, imidazole, benzimidazole, purine, pyrazole, indazole, oxazole, benzoxazole, isoxazole, benzisoxazole, thiazole, benzothiazole, pyridine, bipyridine, quinolone, isoquinoline, pyrazine, quinoxaline, acridine, pyrimidine, quinazoline, pyridazine, cinnoline, phthalazine, tetrazine, triazine, benzothiadiazole, or a combination thereof.

The first repeating unit is, for example, 2,7-fluorene, 9,9-dioctylfluorenyl-2,7-diyl, 2,5-thiophene, or a combination thereof. The second repeating unit is selected differently from the first repeating unit, contains a heteroatom-containing aromatic backbone, and is for example, 2,5-thiophene, 2,5-pyridine, 2,6-pyridine, 2,5-furan, 2,5-pyrrole, or a combination thereof. The mixing molar ratio of the first repeating unit is, for example, 1 to 99 mol %.

The copolymer is, for example, poly[(9,9-dioctylfluorenyl-2,7-diyl)-alt-co-(6,6'-(2,2'-bipyridine))] (PFO-BPy).

In the carbon nanotube having the heteroatom-containing aromatic polymer coating film, the mixing ratio of the heteroatom-containing aromatic polymer and the carbon nanotube is, for example, 0.5:1 to 3:1 by weight.

A difference in solubility parameter between the bifunctional hydrogen-bond linker and the hydrophobic solvent is about 3 MPa$^{1/2}$ to about 30 MPa$^{1/2}$, about 4 MPa$^{1/2}$ to about 25 MPa$^{1/2}$, about 4.2 MPa$^{1/2}$ to about 10 MPa$^{1/2}$, about 4.5 MPa$^{1/2}$ to about 8 MPa$^{1/2}$, about 4.7 MPa$^{1/2}$ to about 6 MPa$^{1/2}$, about 4.9 MPa$^{1/2}$ to about 5.5 MPa$^{1/2}$, or about 5 MPa$^{1/2}$. When the difference in solubility parameter between the bifunctional hydrogen-bond linker and the hydrophobic solvent is within the above range, a hydrophilic and hydrophobic interface may be formed to obtain a layer separation structure. The solubility parameter of the bifunctional hydrogen-bond linker is about 25 MPa$^{1/2}$ to about 50 MPa$^{1/2}$ (e.g., about 35 MPa$^{1/2}$ to about 50 MPa$^{1/2}$), and the solubility parameter of the hydrophobic solvent is about 14 MPa$^{1/2}$ to about 20 MPa$^{1/2}$.

The solubility parameter may be calculated at 25° C. using Van Krevelen method [refer to Bicerano, J. Prediction of polymer properties, third edition, Marcel Dekker Inc. New York (2002)], which is a known method. The Van Krevelen method is a calculation method using a group contribution theory, and the solubility parameter is defined by Equation 1.

$$\delta(\text{solubility parameter}) = \sqrt{e_{coh}} = \sqrt{\frac{E_{coh}}{V}} \quad [\text{Equation 1}]$$

In Equation 1, $E_{coh}$ refers to cohesive energy, V refers to molar volume, and $e_{coh}$ refers to cohesive energy density. The cohesive energy $E_{coh}$ is defined by Equation 2.

$$E_{coh} = 10570.9 \times (^0X^v - {}^0X) + 9072.8 \times (2 \times {}^1X - {}^1X^v) + 1018.2 \times N_{VKH} \quad [\text{Equation 2}]$$

In Equation 2, $^0X$, $^1x$, $^0X^v$, and $^1X^v$ each refers to a connectivity index, and $N_{VKH}$ refers to a correlation coefficient. Each of them is calculated with reference to a published literature [Bicerano, J. Prediction of polymer properties, third edition, Marcel Dekker Inc., New York (2002)].

The solubility parameter is referred to as a Hildebrand solubility parameter. Based on this parameter, the solubility parameters of chloroform and toluene, which are hydrophobic solvents, are levels of 18.2 MPa$^{1/2}$ and 18.7 MPa$^{1/2}$, respectively, and the solubility parameter of PFO-Bpy, which is a coating film polymer disposed on the surface of CNT, is a level of about 18.0 MPa$^{1/2}$. These solubility parameters are matched with each other to have high dispersibility. In contrast, the solubility parameter of propanediol, which is one of the bifunctional hydrogen-bond linkers, is a level of about 28 MPa$^{1/2}$. When this material is mixed with the above-described hydrophobic solvent and CNT composites, two phases of hydrophobicity and hydrophilicity coexist, and thus phase separation may occur. A difference in solubility parameter between hydrophobic materials (CNT composite and hydrophobic solvent) and a hydrophilic material (bifunctional hydrogen-bond liker) may be controlled to be 3 MPA$^{1/2}$ to 30 MPa$^{1/2}$, 4 MPa$^{1/2}$ to 25 MPa$^{1/2}$, 4.2 MPa$^{1/2}$ to 10 MPa$^{1/2}$, 4.5 MPa$^{1/2}$ to 8 MPa$^{1/2}$, 4.7 MPa$^{1/2}$ to 6 MPa$^{1/2}$, 4.9 MPa$^{1/2}$ to 5.5 MPa$^{1/2}$, or about 5 MPa$^{1/2}$.

The surface energy of the bifunctional hydrogen-bond linker is about 35 mN/m to about 55 mN/m or about 40 mN/m to about 50 mN/m, and the surface energy of the hydrophobic solvent is about 25 mN/m to about 32 mN/m or about 28 mN/m to about 30 mN/m. A difference in surface energy between the substrate and the bifunctional hydrogen-bond linker is about 1 mN/m to about 15 mN/m, and a difference in surface energy between the bifunctional hydrogen-bond linker and the hydrophobic solvent is about 3 mN/m to about 20 mN/m.

The surface energy of the substrate is about 39 mN/m to about 45 mN/m, and the surface energy of the substrate is controlled to be higher than the surface energy of the bifunctional hydrogen-bond linker. When the surface energies of the substrate, the bifunctional hydrogen-bond linker and the hydrophobic solvent and the differences among their surface energies are within the above-described ranges, hydrophilic and hydrophobic interfaces are formed to obtain a layer separation structure.

As used herein, the "surface energy" may be evaluated by dropping deionized water and diiodomethane into the sample 10 times, respectively, obtaining an average value of contact angles, and substituting the average value of contact angles to Owens-Wendt-Rabel-Kaelble method (KSDF1229-0033/2015-3/18-26, http://www.ksdf.or.kr/journal/board_files/V.27,no.1,Mar.1_1199.pdf).

In the bifunctional hydrogen-band linker according to some example embodiments, the diol-based compound is 2-butene-1,4-diol, 1,3-propane-diol, 1,4-butanediol, 2-butene-1,4-diol, 1,2-dodecanediol, 1,2-hexadecanediol, 1,9-nonanediol, or a combination thereof. The dicarboxylic acid-based compound is, for example, a dicarboxylic acid having 2 to 9 carbon atoms, and specifically oxalic acid, malonic acid, succinic acid, glutaric acid, adipic acid, pimelic acid, suberic acid, azelaic acid, or a mixture of two or more thereof. The disulfonic acid-based compound includes, for example, 1,2-ethane-disulfonic acid.

The bifunctional hydrogen-bond linker is 2-butene-1,4-diol, 1,3-propane-diol, 1,4-butanediol, 2-butyne-1,4-diol, 1,2-dodecanediol, 1,2-hexadecanediol; 1,9-nonanediol, oxalic acid, malonic acid, succinic acid, glutaric acid, adipic acid, pimelic acid, suberic acid, azelaic acid, 1,2-ethane-disulfonic acid, or a combination thereof. The hydrophobic solvent is chloroform, dichloromethane, N,N-dimethylformamide, benzene, dichlorobenzene, toluene, xylene, or a combination thereof.

Heat treatment of the composition contacting the surface-treated substrate is performed. The heat treatment is performed at about 60° C. to about 200° C., about 80° C. to about 180° C., or about 80° C. to about 150° C. When the heat treatment is performed in this way, the hydrophilic hydrogen-bond linker and the hydrophobic solvent excessively present on the substrate are removed to form a carbon nanotube monolayer film.

In the process of contacting the surface-treated substrate with the composition, a coating speed is about 0.1 mm/min to about 50 mm/min, about 0.5 mm/min to about 30 mm/min, or about 0.5 mm/min to about 20 mm/min. When the coating speed is within the above range, a hydrogen bond is formed around the bifunctional hydrogen-bond linker to improve a CNT-CNT interaction, and this interaction becomes stronger compared to the case of self-assembly by a conventional CNT-CNT hydrophobic interaction (π-π stacking), thereby improving CNT packing density and alignment f-factor characteristics. The term "coating speed" refer to a rate at which the thickness of the composition on the substrate grows during the process via the various methods for applying the composition to the substrate.

FIG. 1 illustrates a structure in which a carbon nanotube (CNT) monolayer film is formed on a substrate according to some example embodiments. FIG. 2 illustrates a process of preparing the structure of FIG. 1 according to some example embodiments.

Referring to FIGS. 1 and 2 and Formula 1 below, propanediol is used as the bifunctional hydrogen-bond linker 13, and PFO-BPy is used as the heteroatom-containing aromatic polymer. As can be seen from Formula 1 below, the nitrogen atom of PFO-BPy forms a hydrogen bond with the hydrogen of a hydroxy group of propanediol A, and a CNT composite 12 is aligned as shown in FIG. 2 through this hydrogen bond. The CNT composite 12 includes CNT and a PFO-BPy coating film on the surface of the CNT. In FIGS. 1 and 2, reference numeral 14 indicates a hydrophobic solvent.

[Formula 1]

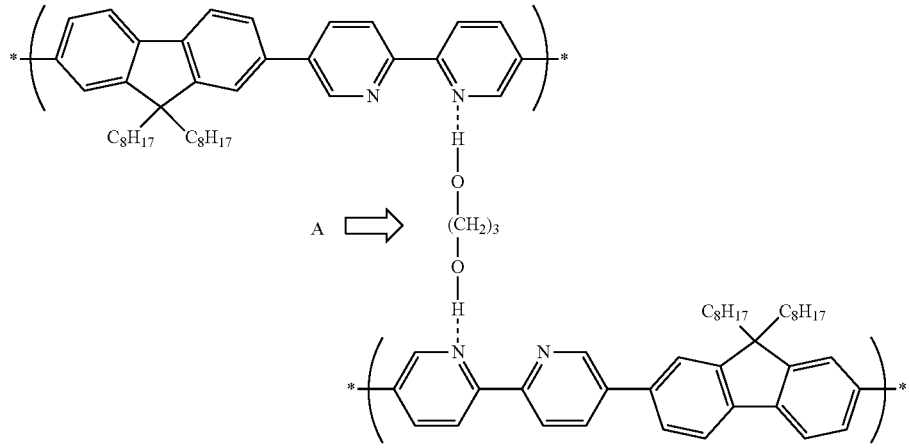

As shown in FIG. 2 and Formula 1, in the substrate 10 surface-treated with the bifunctional hydrogen-bond linker 13, the CNT composite forms hydrogen bonds with each other through the bifunctional hydrogen-bond linker 13, to prepare a high-density and regularly aligned single CNT film or multi-layer CNT film. The thickness of the multi-layer CNT film is about 0.005 μm to about 2 μm, or about 0.5 μm to about 1 μm.

In the method of preparing a carbon nanotube monolayer film according to some example embodiments, a showering process using a benzene-based solvent may be further performed after the above-described heat treatment. When such a showering process is further performed, defects and the like may be removed. The benzene-based solvent is, for example, at least one of benzene, toluene, or xylene.

According to the method of preparing a single CNT film according to some example embodiments, it is possible to secure a CNT density of 120 ea/μm or more, and it is possible to form a highly aligned CNT thin film having a CNT orientation factor (f>0.7) or more. When such a CNT thin film is applied to a FET device, contact resistance between an electrode and a CNT conductive channel is reduced, and thus electrical characteristics are excellent.

According to some example embodiments, there is provided a carbon nanotube monolayer film prepared by the above-described method, wherein the carbon nanotube monolayer film includes a plurality of carbon nanotube composites and a plurality of bifunctional hydrogen-bond linkers, each of the carbon nanotube composites includes carbon nanotubes and a heteroatom-containing aromatic polymer coating film on surfaces thereof (e.g., surfaces of the carbon nanotubes), and the plurality of carbon nanotube composites are bonded to each other through hydrogen bonds by the bifunctional hydrogen-bond linkers.

According to some example embodiments, there is provided a carbon nanotube monolayer film having a carbon nanotube density (e.g., a density of carbon nanotubes in the carbon nanotube monolayer film) of about 60 ea/μm to about 350 ea/μm, for example about 100 ea/μm to about 350 ea/μm.

In the carbon nanotube monolayer film, f-factor is about 0.4 to about 0.8.

FIG. 1 shows the state of a two-dimensional CNT film formed on a substrate according to the above-described method of preparing a carbon nanotube monolayer film according to some example embodiments.

Referring to FIG. 1, a substrate 10 is surface-treated with propanediol 13 to form a hydrophilic interface, a hydrophobic interface in which CNT composites 12 are dispersed in chloroform 14 as a hydrophobic solvent is formed, and this hydrophilic/hydrophobic interface forms an immiscible interface. Hydrogen bonding-induced CNT assembly occurs through this interface, thereby forming a single CNT film. Here, the CNT composite 12 has a structure including a CNT 15 and a PFO-Bpy coating film 11 formed on the surface of the CNT 15.

The CNT pitch is about 1 nm to about 3 nm or about 1 nm to about 2 nm, and the distance between the CNT composites 12 is about 1 nm to about 2 nm. The existence of such a distance may be confirmed through XPS analysis or the like.

Figure 12:
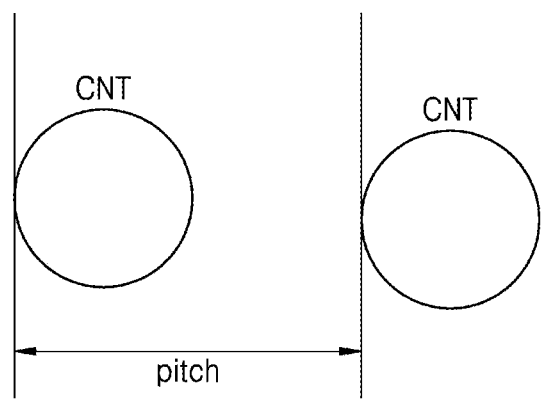
FIG. 12 illustrates a view explaining the pitch of CNTs according to some example embodiments.

FIG. 12 illustrates a view explaining the pitch of CNTs according to some example embodiments.

As used herein, the "pitch" is defined as shown in FIG. 12. In contrast, in a conventional CNT film aligned by van der Waals force, the distance between CNT and CNT is about 25 nm.

According to some example embodiments, there is provided a carbon nanotube monolayer film including: a plurality of carbon nanotube composites; and a plurality of bifunctional hydrogen-bond linkers, wherein each of the carbon nanotube composites includes carbon nanotubes and a heteroatom-containing aromatic polymer coating film on surfaces thereof, and the plurality of carbon nanotube composites are bonded to each other through hydrogen bonds by the bifunctional hydrogen-bond linkers. In the carbon nanotube monolayer film, the density of carbon nanotubes (e.g., the density of carbon nanotubes in the carbon nanotube monolayer film) is about 60 ea/μm to about 350 ea/μm, about 100 ea/μm to about 350 ea/μm, about 120 ea/μm to about 345 ea/μm, about 140 ea/μm to about 340 ea/μm, about 160 ea/μm to about 338 ea/μm, about 180 ea/μm to about 335 ea/μm, or about 200 ea/μm to about 330 ea/μm.

The thickness of the carbon nanotube monolayer film is about 0.5 nm to about 10 nm, about 0.8 nm to about 8 nm, or about 1 nm to about 5 nm. In the carbon nanotube monolayer film, the f-factor is about 0.4 to about 0.8, about 0.5 to about 0.8, or about 0.7 to about 0.8. In the carbon nanotube monolayer film, the pitch of CNT is about 1 nm to about 3 nm. In the carbon nanotube monolayer film, the density is preceding packing density, and may be evaluated through a scanning electron microscope. Further, in the carbon nanotube monolayer film, the pitch of carbon nanotubes may be evaluated from scanning electron microscopy and transmission electron microscopy images.

As used herein, the "f-factor" is measured by Herman's orientation factor evaluation method (paper: Polymer engineering and science, Volume 23, Issue 5, April 1983, pages 247-256)). When the f-factor is 0, it means random, and when the f-factor is 1, it is defined as a completely unidirectional array.

As described above, according to the method of preparing a single CNT single film according to some example embodiments, a hydrophobic solvent and a hydrophilic solvent are phase-separated to have immiscibility with each other, and thus forms a hydrophilic/hydrophobic interface. A two-dimensional reaction proceeds at the interface, so that hydrogen bonds are formed only at the interface. Such an immiscible interface may be formed by controlling the surface energy of the substrate while controlling the solubility parameters and surface energy of the hydrophilic solvent and the hydrophobic solvent. A high-density single CNT film may be prepared through hydrogen bonding surface reaction (hydrogen bonding-induced CNT assembly) at the hydrophilic and hydrophobic interfaces.

According to some example embodiments, there is provided an electronic device including the carbon nanotube monolayer film according to some example embodiments.

According to some example embodiments, there is provided an electronic device including a carbon nanotube monolayer film, the carbon nanotube monolayer including: a plurality of carbon nanotube composites; and a plurality of bifunctional hydrogen-bond linkers, wherein each of the carbon nanotube composites includes carbon nanotubes and a heteroatom-containing aromatic polymer coating film on surfaces thereof, the plurality of carbon nanotube composites are bonded to each other through hydrogen bonds by the bifunctional hydrogen-bond linkers, and density of the carbon nanotubes is about 60 ea/μm to about 350 ea/μm.

According to some example embodiments, there is provided an electronic device including a carbon nanotube monolayer film having a carbon nanotube density of about 100 ea/μm to about 350 ea/μm.

Figure 8:
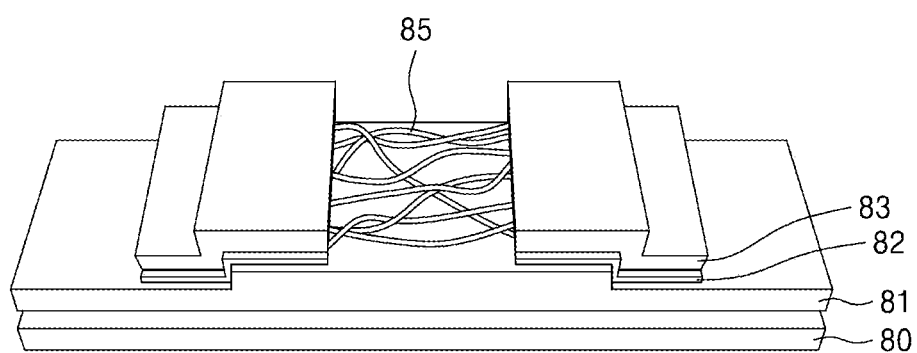
FIG. 8 illustrates a laminate structure of a carbon nanotube field-effect transistor (CNT-FET) according to some example embodiments.
Figure 10:
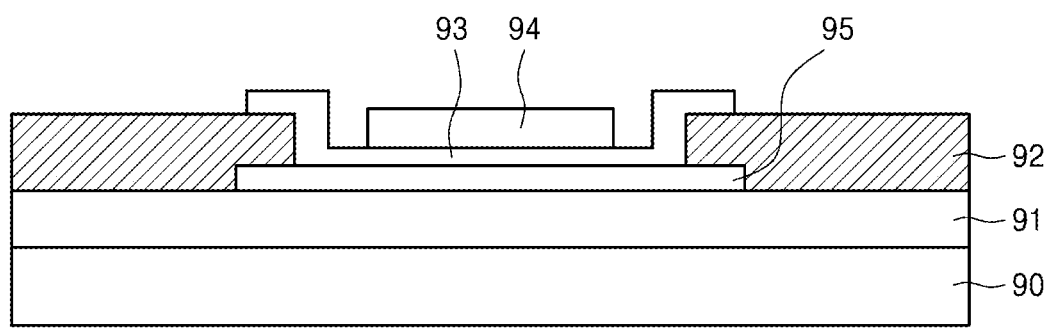
FIG. 10 illustrates a laminate structure of a carbon nanotube field-effect transistor (CNT-FET) according to some example embodiments.

The electronic device may be a field-effect transistor, for example as shown in FIGS. 8 and 10, a chemical/biological sensor, or an NIR photodetector. The CNT film according to some example embodiments may be used for wearable devices and neuromorphic computing.

The electronic device according to some example embodiments may include a multi-layer carbon nanotube film having a plurality of carbon nanotube monolayer films. The thickness of the multi-layer carbon nanotube film is about 0.005 jam to about 2 µm (about 5 nm to about 2,000 nm), about 50 nm to about 500 nm, about 80 nm to about 300 nm, about 85 nm to about 150 nm, or about 90 nm to about 110 nm.

According to some example embodiments, there is provided field-effect transistor (FET) including: a substrate; source and drain electrodes disposed on the substrate to be spaced apart from each other; the above-described carbon nanotube monolayer film electrically connected to the source and drain electrodes; a gate electrode; and a gate insulating layer.

The FET may include a multi-layer carbon nanotube film having a plurality of carbon nanotube monolayer films. The thickness of the multi-layer carbon nanotube film is about 0.005 µm to about 2 µm (about 5 nm to about 2,000 nm), about 50 nm to about 500 nm, about 80 nm to about 300 nm, about 85 nm to about 150 nm, or about 90 nm to about 110 nm.

The FET may have a top electrode contact (TEC) structure, a bottom electrode contact (BEC) structure, or a dual electrode contact structure.

The carbon nanotube monolayer film or the multi-layer carbon nanotube film has a channel length ranging from about 400 nm to about 45 µm.

FIG. 8 illustrates a laminate structure of a carbon nanotube field-effect transistor (CNT-FET) according to some example embodiments.

An insulating layer 81 is formed on a substrate 80, and a pair of electrodes 83 are formed in a particular (or, alternatively, predetermined) region on the insulating layer 81.

Examples of the substrate 80 include, but are not limited to, a silicon wafer, a glass substrate, a plastic film made of any one selected from polyethersulfone, polyacrylate, polyetherimide, polyimide, polyethylene terephthalate, and polyethylene naphthalene, and a glass substrate coated with indium tin oxide.

As the substrate 80, for example, a silicon substrate can be used, and serves as a back gate electrode and a dielectric. A conductive channel 85 including a carbon nanotube monolayer film according to any of the example embodiments is formed between the electrodes 83. Here, the electrodes 83 are electrically connected to both ends of the carbon nanotube monolayer film. An adhesive layer 82 is disposed between the electrodes 83 and the insulating layer 81. The adhesive layer contains nickel or the like, and has a thickness of about 0.5 nm to about 2 nm, for example, 1 nm.

The insulating layer 81 is included as a single or multi-layer organic or inorganic film, or is included as an organic-inorganic hybrid film. The organic insulating film is formed of at least one of polymethylmethacrylate (PMMA), polystyrene (PS), phenolic polymer, acrylic polymer, imide-based polymer such as polyimide, arylether-based polymer, amide-based polymer, fluorine-based polymer, p-xylylene-based polymer, vinyl alcohol-based polymer, or parylene. The inorganic insulating film is formed of at least one of silicon oxide ($SiO_2$), silicon nitride, $Al_2O_3$, $Ta_2O_5$, BST, or PZT.

The electrode 83 may be formed as a single layer including Au, Al, Ag, Mg, Ca, Yb, Cs-ITO, or an alloy thereof, and may be formed as multiple layers further including an adhesive metal layer such as a Ti, Cr or Ni layer.

In the conductive channel including the single CNT single film, the channel length is about 30 µm to about 50 µm, for example, 40 µm.

FIG. 10 illustrates a laminate structure of a carbon nanotube field-effect transistor (CNT-FET) according to some example embodiments.

Referring to FIG. 10, an insulating layer 91 is disposed on a substrate 90, and a conductive channel 95 including a CNT film (e.g., a carbon nanotube monolayer film according to any of the example embodiments) is formed on the insulating layer 91. The conductive channel 95 may have a multi-layer CNT film structure in which a plurality of single CNT films are stacked. Source and drain electrodes 92 are spaced apart from each other (e.g., isolated from direct contact with each other) on the substrate 90 and are electrically connected to the conductive channel 95, a buffer layer 93 (e.g., a gate insulating layer) is formed on a part of the conductive channel 95, and a gate electrode 94 is disposed on a part of the buffer layer 93. In FIG. 10, the conductive channel 95 has a channel length of about 300 nm to about 600 nm, for example, 500 nm. As described above, the channel length of the FET of FIG. 10 is smaller than that of the FET of FIG. 8.

The substrate 90, insulating layer 91 and the source and drain electrodes 92 in FIG. 10 may be made of the same materials as the substrate, insulating layer and electrodes in FIG. 8.

The buffer layer 93 may contain $SiO_2$, or a high-k dielectric material such as hafnium oxide ($HfO_2$), magnesium oxide (MgO), or AlN. Further, the gate electrode 94 on a part of the buffer layer 93 may be formed of any one selected from Pt/Ti, aluminum (Al), an aluminum alloy (Al-alloy), molybdenum (Mo), a molybdenum alloy (Mo-alloy), silver nanowires, gallium indium eutectic, PEDOT, and PSS.

In the CNT film-containing conductive channel of the field-effect transistor according to some example embodiments, CNTs are regularly arranged.

In the field-effect transistor according to some example embodiments, an on-off ratio is about $10^1$ to about $10^8$, for example, $10^3$, and an on-current is about 10 mA/mm to about 100 mA/mm.

Hereinafter, the present inventive concepts will be described in more detail with reference to the following Examples, but the scope of the present inventive concepts is not limited to these Examples.

(Preparation of CNT Film)

Example 1

A silicon substrate was dip-coated with 1,3-propanediol to obtain a silicon substrate dip-coated with 1,3-propanediol.

Separately, CNTs (CNT composites) each having a coating film containing a PFO-BPy copolymer (molar ratio of PFO and BPy=1:1) were mixed with chloroform to obtain a composition. The content of CNT composites in the composition is about 10 µg/ml.

A silicon substrate dip-coated with 1, 3-propanediol was contacted with the composition by dip coating. In this case, the dip coating was performed at a speed of about 0.5 mm/min.

The silicon substrate dip-coated with the composition was heat-treated at about 80° C. to prepare a single CNT film.

Examples 2 to 4

Single CNT films were prepared in the same manner as in Example 1, except that the dip coating speed was changed as shown in Table 1 below.

TABLE 1

| Class. | Dip coating speed (mm/min) |
| --- | --- |
| Example 1 | 0.5 |
| Example 2 | 5 |
| Example 3 | 20 |
| Example 4 | 50 |

Comparative Example 1

A single CNT film was prepared in the same manner as in Example 1, except that a silicon substrate was used instead of the silicon substrate dip-coated with 1,3-propanediol and the heat treatment was performed at 80° C.

In the single CNT film obtained according to Comparative Example 1, the van der Waals interaction of CNT-CNT was about 4 kJ/mol, and the CNT-CNT distance was about 25 nm, whereas in the single CNT film obtained according to Example 1, the interaction between the carbon nanotubes and 1,3-propanediol, which is a bifunctional hydrogen-bond linker, was greatly increased to about 21 kJ/mol, and the CNT-CNT distance was about 2 nm to increase density. Here, the CNT-CNT distance may be confirmed through SEM analysis, and the interaction between carbon nanotubes and 1,3-propanediol, which a bifunctional hydrogen-bond linker, and the van der Waals interaction of CNT-CNT may be confirmed by the results of XPS analysis of FIG. 13.

Figure 13:
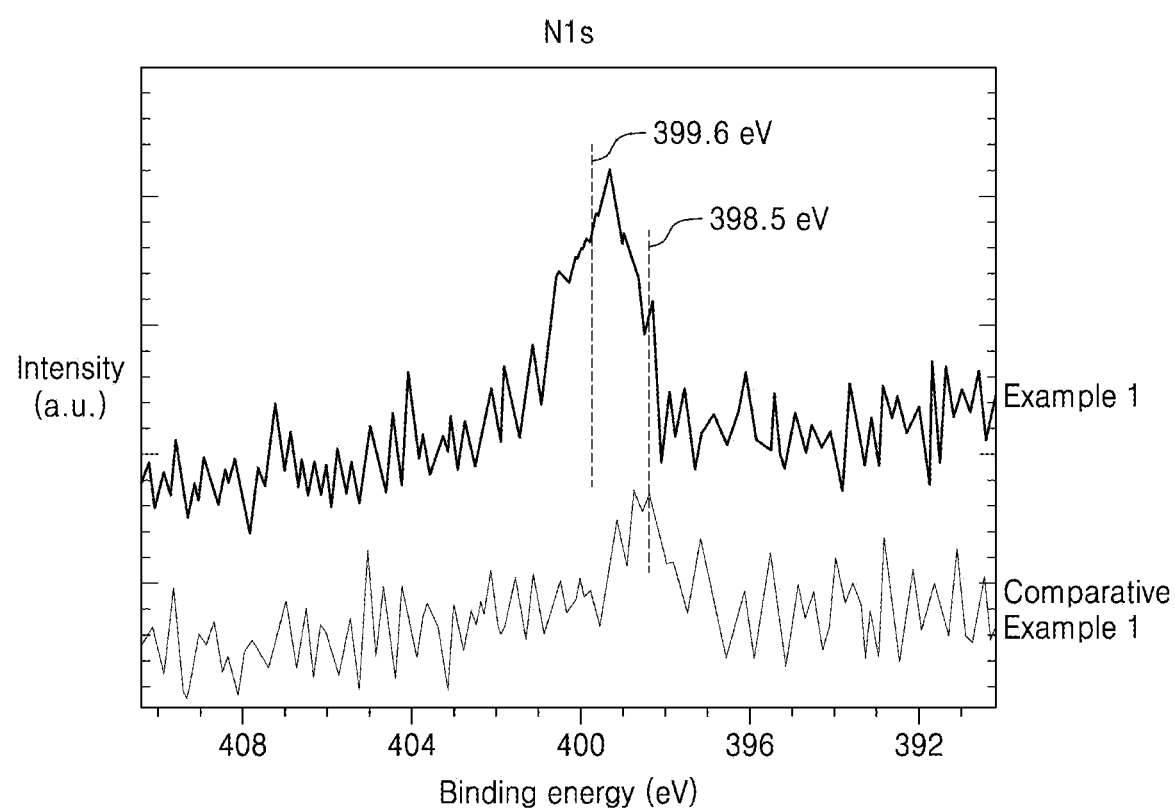
FIG. 13 illustrates the results of X-ray photoelectron spectroscopy (XPS) analysis of N1s of Example 1 and Comparative Example 1 according to some example embodiments.

FIG. 13 illustrates the results of X-ray photoelectron spectroscopy (XPS) analysis of N1s of Example 1 and Comparative Example 1 according to some example embodiments.

Referring to FIG. 13, in the single CNT film of Example 1, the N1s binding energy was shifted to 399.6 eV compared to the binding energy (398.5 eV) of the single CNT film of Comparative Example 1.

(Manufacture of CNT-FET Device)

Manufacture Example 1

A silicon oxide layer, which is an insulating layer, was formed to a thickness of about 50 nm on a Si substrate usable as a back gate electrode and a dielectric, and a pair of electrodes were deposited with Au on a particular (or, alternatively, predetermined) region of the silicon oxide layer to form an Au layer having a thickness of about 40 nm.

A nickel layer, which is an adhesive layer, are formed to a thickness of about 1 nm between the silicon oxide layer and the Au layer to prepare a structure. A conductive channel including a carbon nanotube(CNT) monolayer film was formed in a particular (or, alternatively, predetermined) region on the silicon oxide layer of the structure, and a pair of Au electrodes were electrically connected to both ends of the CNT monolayer film to manufacture the CNT-FET device of FIG. 8.

The process of forming the conductive channel including the carbon nanotube (CNT) monolayer film in a particular (or, alternatively, predetermined) region on the silicon oxide layer is performed in the same manner as in Example 1, except that a structure provided with the silicon oxide layer is used instead of the silicon substrate.

The channel length Lc of the conductive channel including the CNT monolayer film is about 40 µm, and the thickness of the single CNT film is about 3 nm.

Manufacture Example 2

A $SiO_2$ insulating layer was formed to a thickness of about 5 nm on a substrate. The $SiO_2$ insulating layer was dip-coated thereon with 1,3-propanediol.

Separately, CNTs (CNT composites) each coated with a PFO-BPy copolymer (molar ratio of PFO and BPy=1:1) were mixed with chloroform to obtain a composition. The content of CNT composites in the composition is about 10 µg/ml.

The resultant product dip-coated with 1,3-propanediol was contacted with the composition by dip coating. In this case, the dip coating was performed at a speed of about 0.5 mm/min.

The structure dip-coated with the composition was heat-treated at about 80° C. to prepare a CNT monolayer film.

Pt/Ti source and drain electrodes were formed at both ends of the single CNT film, and a $HfO_2$ buffer layer was formed to a thickness of about 20 nm so as to cover the single CNT film and to be connected to the source and drain electrodes. A Pt/Ti gate electrode was formed in a particular (or, alternatively, predetermined) region of the buffer layer to manufacture the CNT-FET device of FIG. 10.

The channel length Lc of the conductive channel including the single CNT film is about 500 nm, and the thickness of the single CNT film is about 3 nm.

Comparative Manufacture Example 1

A CNT-FET device was manufactured in the same manner as in Comparative Example 1, except that a structure provided with the silicon oxide layer is used instead of the silicon substrate when the conductive channel including the carbon nanotube (CNT) monolayer film was formed in a particular (or, alternatively, predetermined) region on the silicon oxide layer.

Evaluation Example 1: Transmission Electron Microscope and Scanning Electron Microscope Scanning electron microscope analysis was performed on the surfaces of the CNT monolayer films obtained according to Example 1 and Comparative Example 1, and S-4700 manufactured by Hitachi was used as an SEM analyzer. The results of scanning electron microscope analysis are shown in FIGS. 3A and 3B, respectively.

Figure 3A:
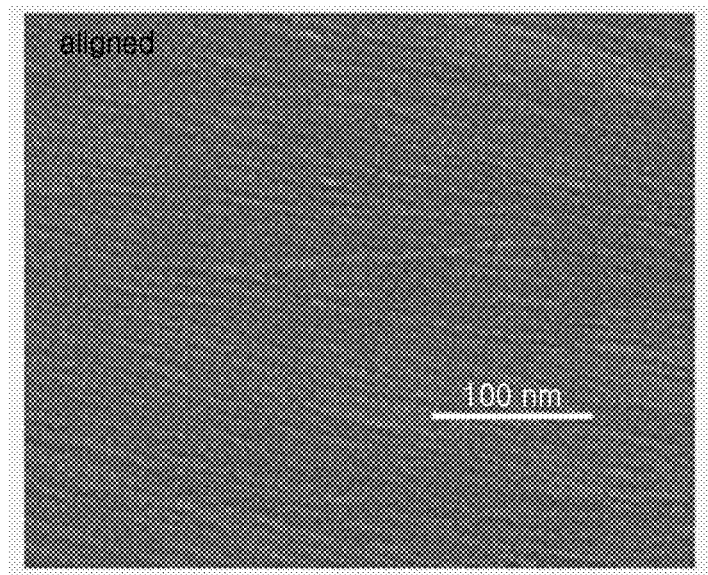
FIG. 3A illustrates a result of scanning electron microscope analysis of a surface of a single CNT film obtained according to Example 1 according to some example embodiments.
Figure 3B:
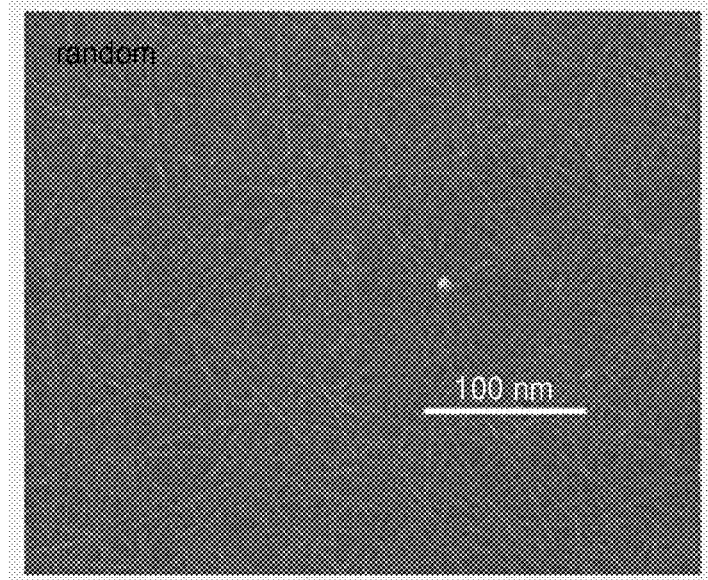
FIG. 3B illustrates a result of scanning electron microscope analysis of a surface of a single CNT film obtained according to Comparative Example 1 according to some example embodiments.

FIG. 3A illustrates a result of scanning electron microscope analysis of a surface of a single CNT film obtained according to Example 1 according to some example embodiments, and FIG. 3B illustrates a result of scanning electron microscope analysis of a surface of a single CNT film obtained according to Comparative Example 1 according to some example embodiments.

Referring to FIGS. 3A and 3B, as shown in FIG. 3A, the CNT monolayer film of Example 1 exhibited high density characteristics while having a well-aligned and oriented two-dimensional single-layer structure.

In contrast, as shown in FIG. 3B, the CNT monolayer film of Comparative Example 1 showed a random alignment structure.

Figure 4A:
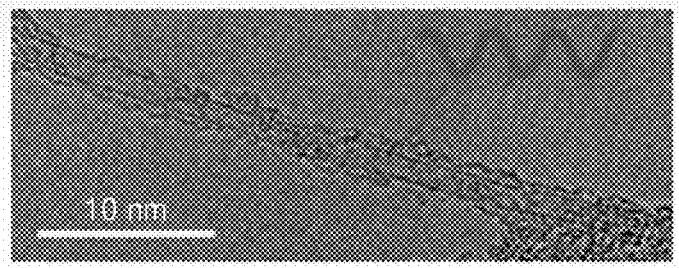
FIGS. 4A and 4B illustrate results of transmission electron microscope (TEM) analysis of a cross-section of the single CNT film obtained according to Example 1 according to some example embodiments.
Figure 4B:
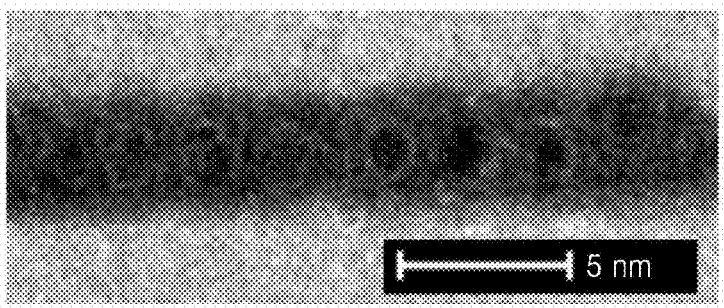

Transmission electron microscope analysis was performed on the cross-section of the single CNT film obtained according to Example 1, and the results thereof are shown in FIGS. 4A and 4B.

FIGS. 4A and 4B illustrate results of transmission electron microscope (TEM) analysis of a cross-section of the single CNT film obtained according to Example 1 according to some example embodiments.

Referring to FIGS. 4A and 4B, it was found that the pitch of the single CNT film was 3 nm and the density (calculated value) thereof was about 333 ea/μm.

Figure 5:
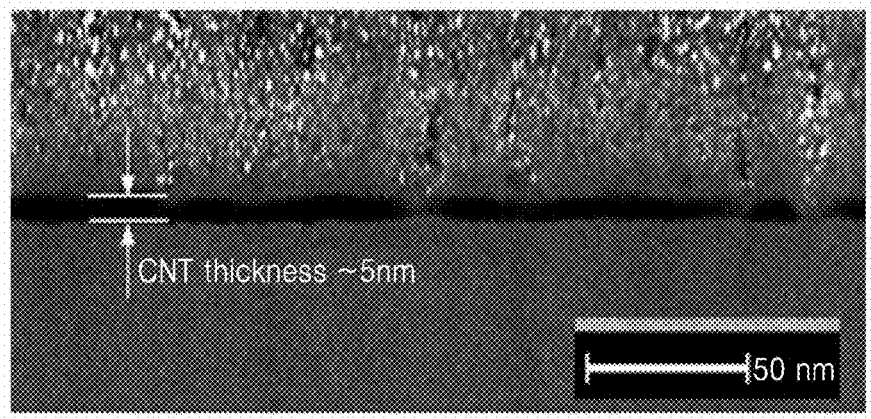
FIG. 5 illustrates a result of focused ion beam-transmission electron microscope (FIB-TEM) analysis of the single CNT film of Example 1 according to some example embodiments.

Focused ion beam (FIB)-transmission electron microscope (FIB-TEM) analysis was performed on the thickness of the CNT monolayer film prepared according to Example 1, and the results thereof are shown in FIG. 5.

FIG. 5 illustrates a result of focused ion beam-transmission electron microscope (FIB-TEM) analysis of the single CNT film of Example 1 according to some example embodiments.

As shown in FIG. 5, it was found that the thickness of the CNT monolayer film was about 5 nm.

Evaluation Example 2: Evaluation of Coating Speed and Densification

The degree of densification of the CNT monolayer films of Examples 1 to 4 according to a change in coating speed change was evaluated using SEM. Hitachi, Ltd.'s S-4700 was used as an SEM analyzer.

Figure 6A:
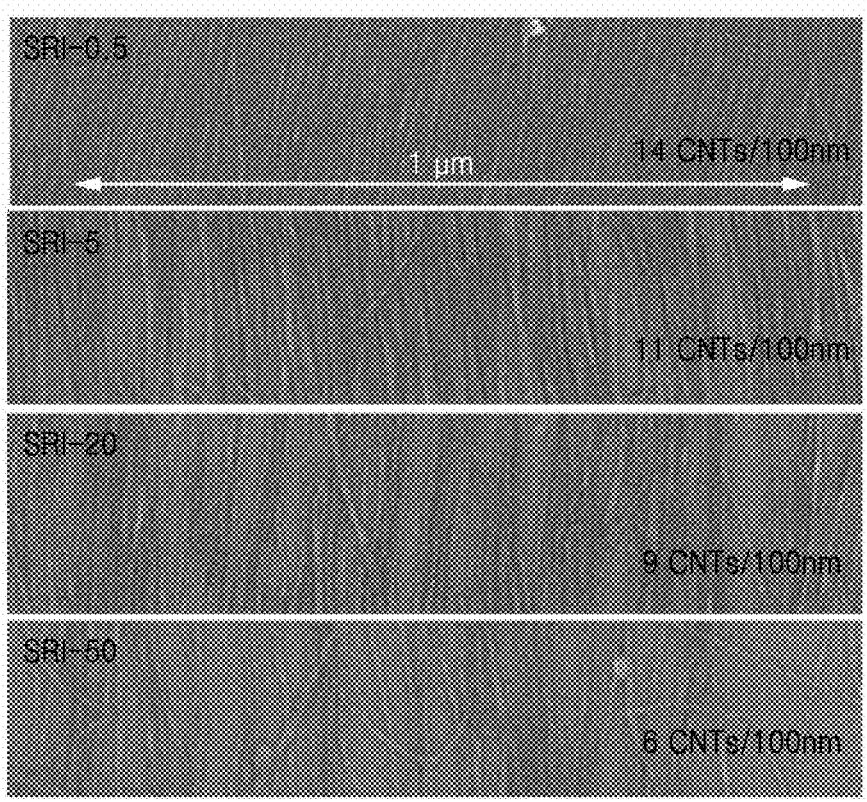
FIG. 6A illustrates a result of examining the degree of densification of single CNT films of Examples 1 to 4 according to a change in coating speed through scanning electron microscopy (SEM) according to some example embodiments.
Figure 6B:
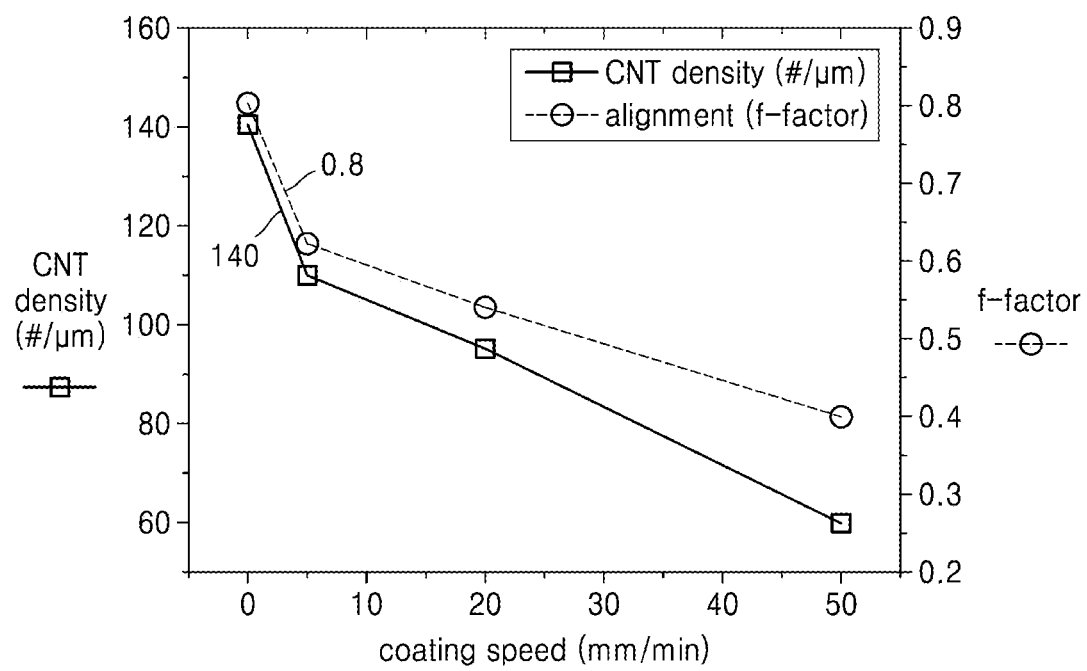
FIG. 6B illustrates an f-factor for CNT density and CNT alignment degree obtained from the results of FIG. 6A according to some example embodiments.

FIG. 6A illustrates a result of examining the degree of densification of single CNT films of Examples 1 to 4 according to a change in coating speed through scanning electron microscopy (SEM) according to some example embodiments. FIG. 6B illustrates an f-factor for CNT density and CNT alignment degree obtained from the results of FIG. 6A according to some example embodiments.

The results of SEM evaluation are shown in FIG. 6A. The CNT density obtained from the results of FIG. 6A and the f-factor for alignment degree of the CNT are shown in FIG. 6B.

Referring to FIGS. 6A and 6B, it may be found that the CNT density of the CNT films of Examples 1 to 4 is excellent as about 60 ea/μm to about 140 ea/μm, and the f-factor is 0.4 to 0.8, and thus the alignment degree of CNT is very excellent.

Figure 7A:
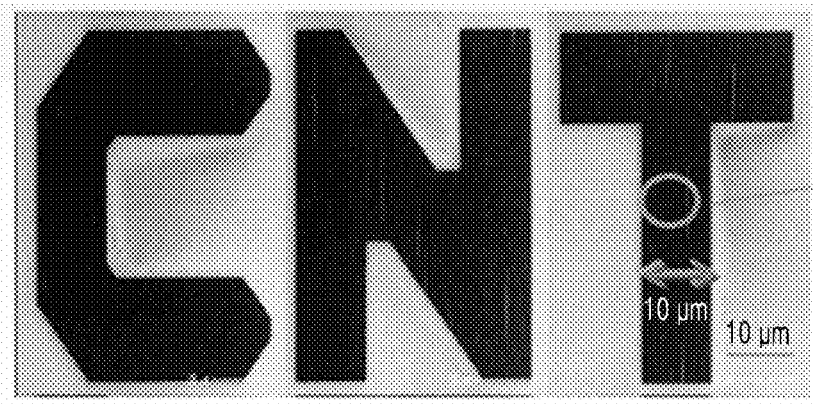
FIG. 7A illustrates a CNT pattern having high density and high alignment characteristics, formed by coating the single CNT film of Example 1 at a coating speed of 0.5 mm/min through a photolithography process using a photoresist according to some example embodiments.
Figure 7B:
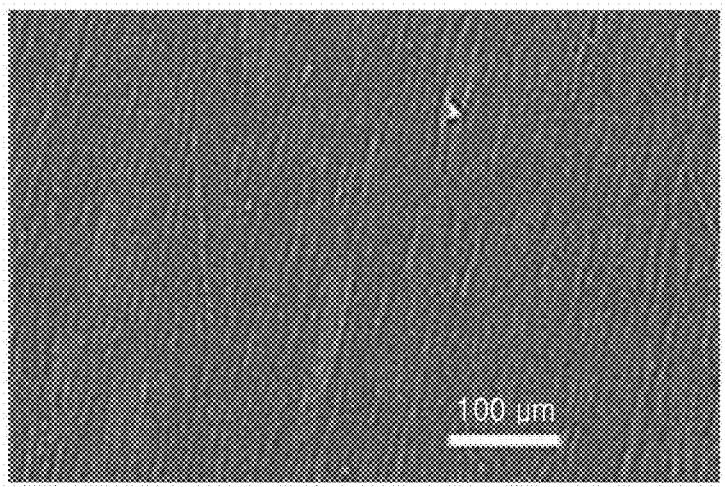
FIG. 7B is an enlarged SEM photograph of the circled region in FIG. 7A according to some example embodiments.

A CNT pattern having high density and high alignment degree characteristics was formed using a photoresist photolithography process by performing dip coating at a coating speed of 0.5 mm/min under the formation conditions of the CNT monolayer film of Example 1, and was shown in FIGS. 7A and 7B.

FIG. 7A illustrates a CNT pattern having high density and high alignment characteristics, formed by coating the single CNT film of Example 1 at a coating speed of 0.5 mm/min through a photolithography process using a photoresist according to some example embodiments. FIG. 7B is an enlarged SEM photograph of the circled region in FIG. 7A according to some example embodiments.

FIG. 7B is an enlarged view of the circled region in FIG. 7A. Referring to FIG. 7B, it was found that the CNT density was about 150 CNT/μm, which was very high, and the f-factor was 0.8, by which the CNT pattern had high alignment degree characteristics.

Evaluation Example 3: Electrical Characteristics of CNT-FET Device

Figure 9A:
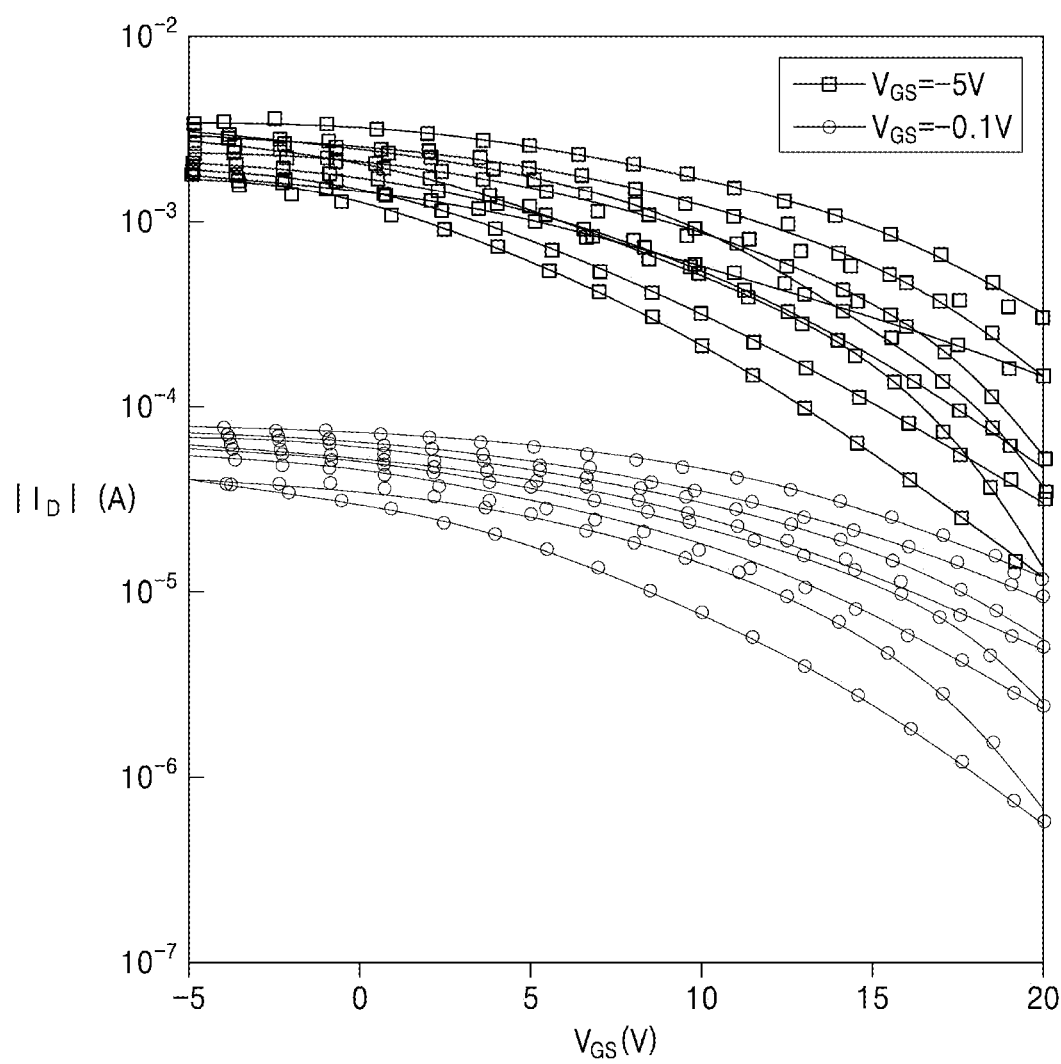
FIGS. 9A and 9B are graphs illustrating I-V characteristics of the CNT-FET of Manufacture Example 1 according to some example embodiments.
Figure 9B:
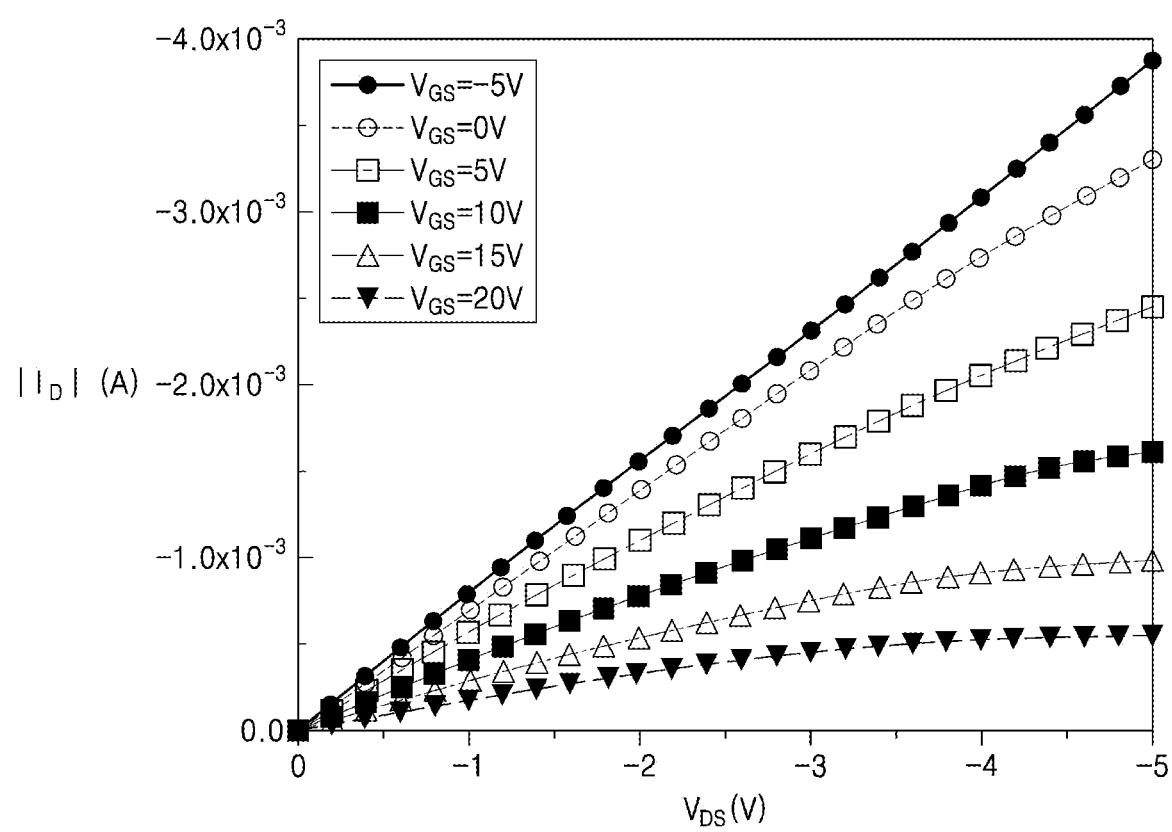
Figure 9C:
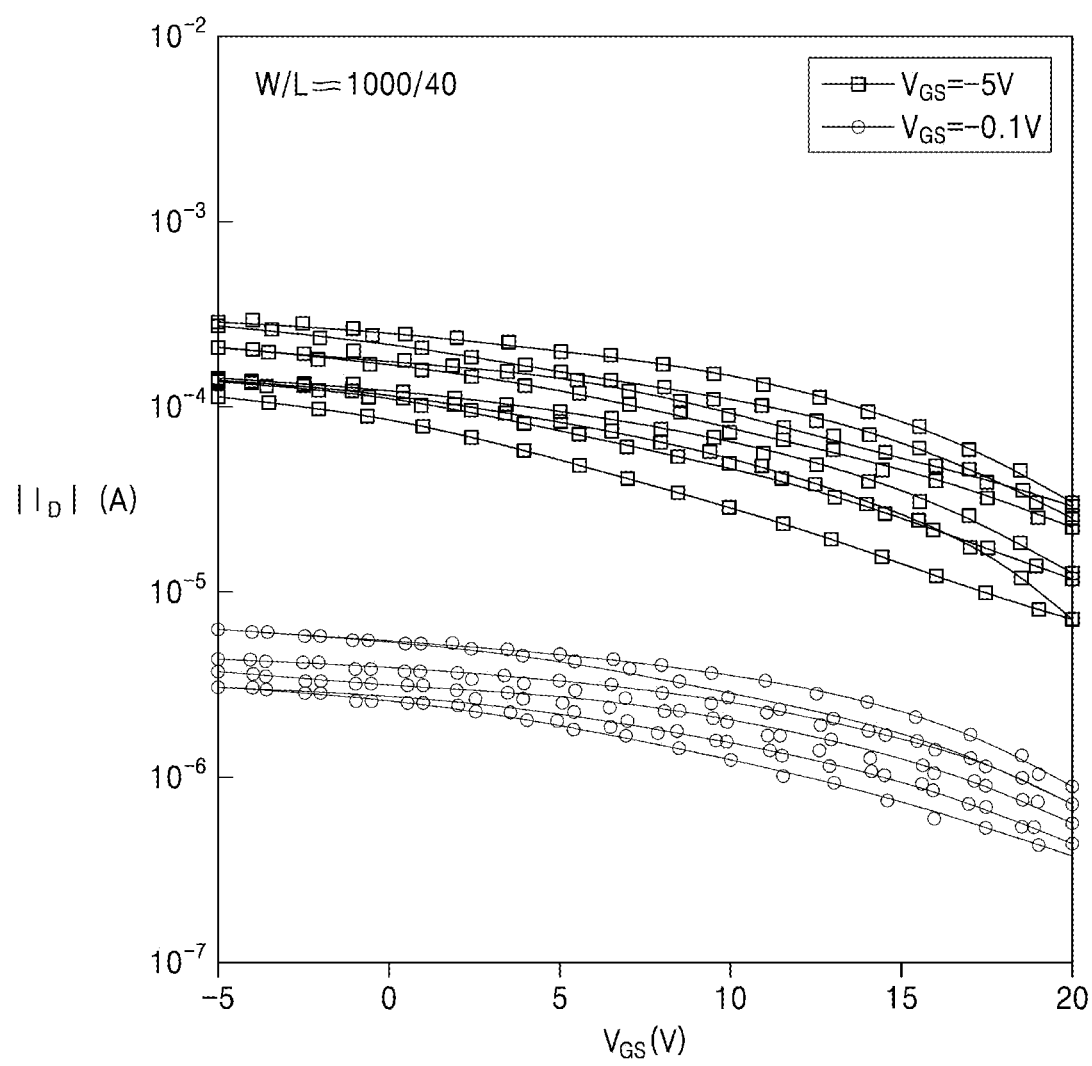
FIGS. 9C and 9D are graphs illustrating I-V characteristics of the CNT-FET of Comparative Manufacture Example 1 according to some example embodiments.
Figure 9D:
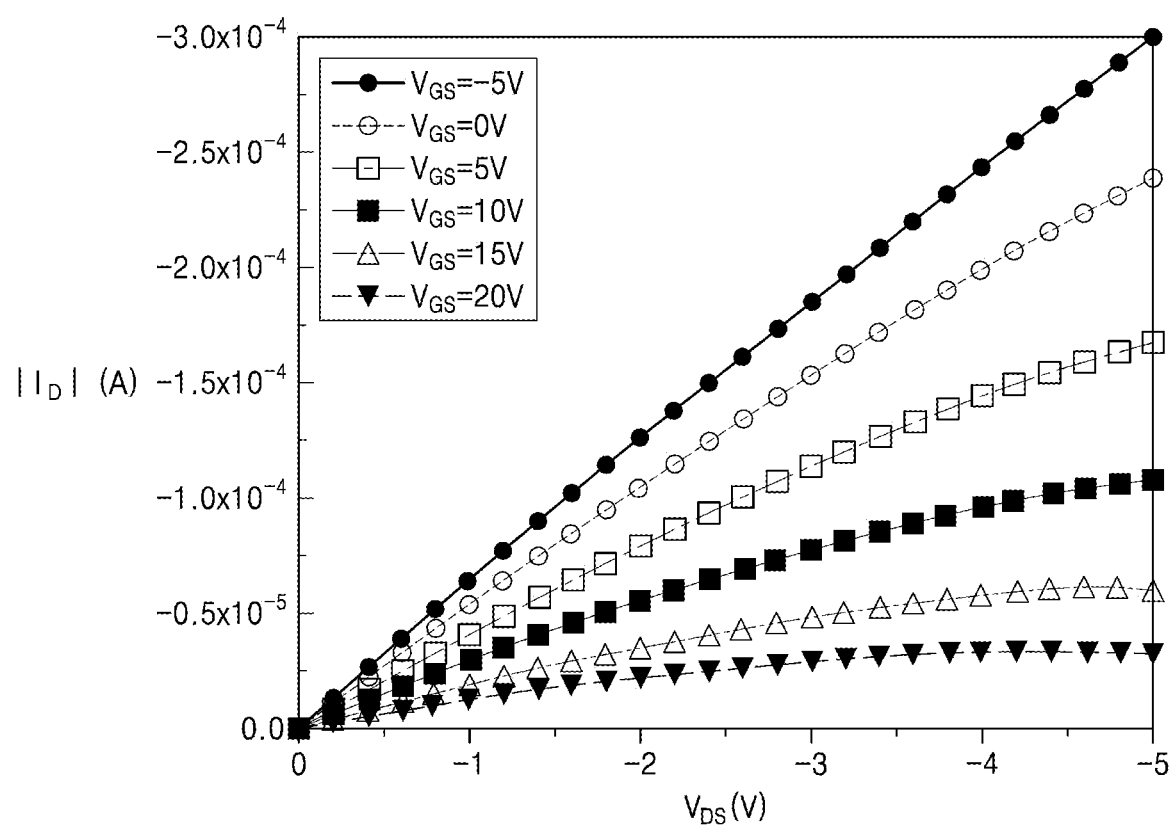

FIGS. 9A and 9B are graphs illustrating I-V characteristics of the CNT-FET of Manufacture Example 1 according to some example embodiments. FIGS. 9C and 9D are graphs illustrating I-V characteristics of the CNT-FET of Comparative Manufacture Example 1 according to some example embodiments.

The contact length Lc (S-D channel length) of each of the CNT-FET devices manufactured according to Manufacture Example 1 and Comparative Manufacture Example 1 was about 40 μm, and FIGS. 9A to 9D show the I-V characteristic curves of these devices. FIGS. 9A and 9C shows transfer curves, and FIGS. 9B and 9D show output curves.

Referring to FIGS. 9A to 9D, the CNT-FET device of Manufacture Example 1 was improved to have a difference of more than 10 times in current and mobility compared to the CNT-FET device of Comparative Manufacture Example 1.

Evaluation Example 4: Electrical Characteristics of CNT-FET Device

Figure 11A:
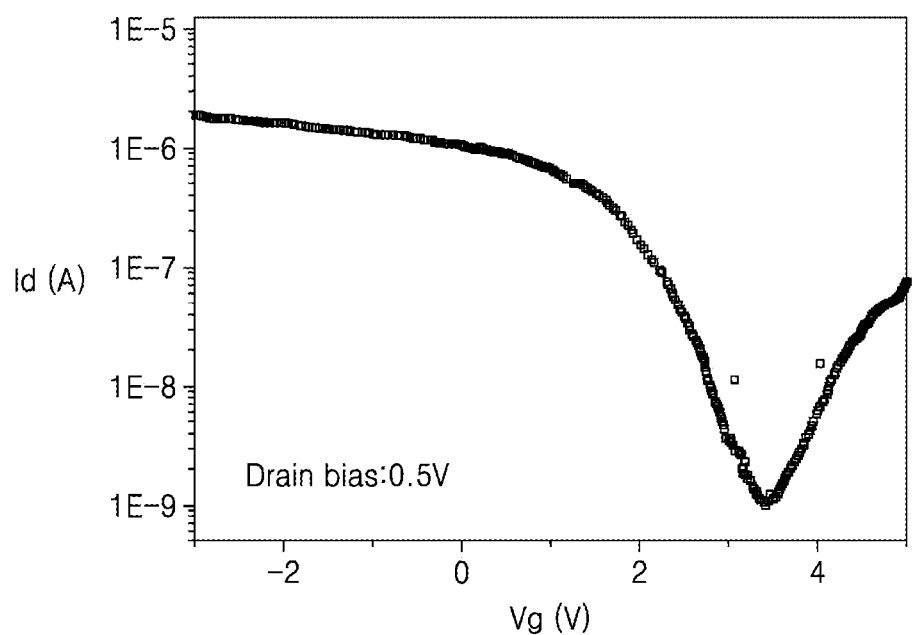
FIGS. 11A and 11B are graphs illustrating I-V characteristics of the CNT-FET of Manufacture Example 2 according to some example embodiments.
Figure 11B:
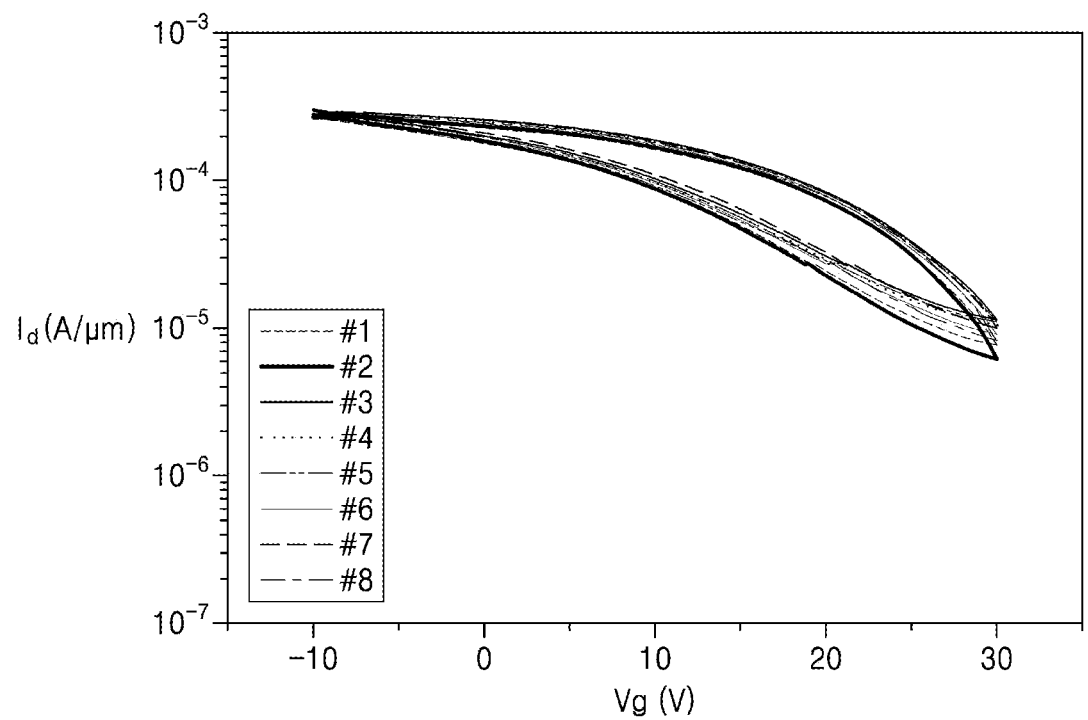

FIGS. 11A and 11B are graphs illustrating I-V characteristics of the CNT-FET of Manufacture Example 2 according to some example embodiments.

I-V characteristics (Ids-Vg characteristics) graphs of the CNT-FET device of Manufacture Example 2 and the CNT-FET device of Comparative Manufacture Example 2 were examined, and shown in FIGS. 11A and 11B. In FIG. 11B, #1 to #8 show graphs obtained by repeatedly performing 1 time to 8 times.

The contact length Lc (S-D channel length) of each of the CNT-FET devices of Manufacture Example 2 and Comparative Manufacture Example 2 was about 500 nm. When a voltage Vds was applied to a drain electrode and a source electrode and a positive gate bias voltage Vg was applied, a transistor was turned on.

Referring to FIGS. 11A and 11B, it may be found that the CNT-FET device of Manufacture Example 2 has an on-off ratio of $10^3$, an on-current of 1-5 μA/μm, and a Vds of 5 V or less, and the CNT-FET device normally operates under these conditions. That is, it may be found that a CNT-FET device having an excellent on-off ratio can be manufactured even with a short channel length.

In the CNT-FET device of Comparative Manufacture Example 2, Ion is about 1 mA/μm to about 5 mA/μm and Ion/Ioff is about $10^3$, whereas in the CNT-FET device of Manufacture Example 2, the maximum value of Ion is about 260 mA/μm to about 310 mA/μm.

A carbon nanotube monolayer film according to some example embodiments has high density and improved alignment degree. When such a carbon nanotube monolayer film is used, an electronic device having improved electrical characteristics can be manufactured.

It should be understood that example embodiments described herein should be considered in a descriptive sense only and not for purposes of limitation. Descriptions of features or aspects within each example embodiment should typically be considered as available for other similar features or aspects in other example embodiments. While some example embodiments have been described with reference to the figures, it will be understood by those of ordinary skill in the art that various changes in form and details may be made therein without departing from the spirit and scope as defined by the following claims.

What is claimed is:

1. A method of preparing a carbon nanotube monolayer film, the method comprising:
   applying a bifunctional hydrogen-bond linker onto a substrate to prepare a surface-treated substrate;
   mixing carbon nanotubes having a heteroatom-containing aromatic polymer coating film with a hydrophobic solvent to obtain a composition and contacting the surface-treated substrate with the composition; and
   heat-treating the surface-treated substrate contacting the composition,
   wherein the bifunctional hydrogen-bond linker has a solubility parameter of about 35 MPa$^{1/2}$ to about 50 MPa$^{1/2}$ and has a surface energy of about 35 mN/m to about 55 mN/m.

2. The method of claim 1, wherein
   the bifunctional hydrogen-bond linker includes at least one of a diol-based compound, a dicarboxylic acid-based compound, or a disulfonic acid-based compound.

3. The method of claim 1, wherein
   a difference in solubility parameter between the bifunctional hydrogen-bond linker and the hydrophobic solvent is about 3 MPa$^{1/2}$ to about 30 MPa$^{1/2}$.

4. The method of claim 1, wherein
   a difference in surface energy between the substrate and the bifunctional hydrogen-bond linker is about 1 mN/m to about 15 mN/m, and
   a difference in surface energy between the bifunctional hydrogen-bond linker and the hydrophobic solvent is about 3 mN/m to about 20 mN/m.

5. The method of claim 1, wherein
   the hydrophobic solvent has a solubility parameter of about 14 MPa$^{1/2}$ to about 20 MPa$^{1/2}$, and has a surface energy of about 25 mN/m to about 32 mN/m.

6. The method of claim 1, wherein
   the bifunctional hydrogen-bond linker is 2-butene-1,4-diol, 1,3-propane-diol, 1,4-butanediol, 2-butyne-1,4-diol, 1,2-dodecanediol, 1,2-hexadecanediol, 1,9-nonanediol, oxalic acid, malonic acid, succinic acid, glutaric acid, adipic acid, pimelic acid, suberic acid, azelaic acid, 1,2-ethane-disulfonic acid, or a combination thereof, and
   the hydrophobic solvent is chloroform, dichloromethane, N,N-dimethylformamide, benzene, dichlorobenzene, toluene, xylene, or a combination thereof.

7. The method of claim 1, wherein
   the substrate has a surface energy of about 39 mN/m to about 45 mN/m, and
   the surface energy of the substrate is higher than the surface energy of the bifunctional hydrogen-bond linker.

8. The method of claim 1, wherein
   the heteroatom-containing aromatic polymer coating film includes a heteroatom-containing aromatic polymer that is a copolymer including a conjugated aromatic first repeating unit and a heteroatom-containing aromatic second repeating unit,
   the conjugated aromatic first repeating unit is benzene, naphthalene, anthracene, fluorene, phenylene, furan, benzofuran, isobenzofuran, pyrrole, indole, isoindole, thiophene, bithiophene, benzothiophene, benzo[c]thiophene, imidazole, benzimidazole, purine, pyrazole, indazole, oxazole, benzoxazole, isoxazole, benzisoxazole, thiazole, benzothiazole, pyridine, bipyridine, quinolone, isoquinoline, pyrazine, quinoxaline, acridine, pyrimidine, quinazoline, pyridazine, cinnoline, phthalazine, tetrazine, triazine, benzothiadiazole, or a combination thereof, and
   the heteroatom-containing aromatic second repeating unit is 2,5-thiophene, 2,5-pyridine, 2,6-pyridine, 2,5-furan, 2,5-pyrrole, or a combination thereof.

9. The method of claim 8, wherein
   the conjugated aromatic first repeating unit is 2,7-fluorene, 9,9-dioctylfluorenyl-2,7-diyl, 2,5-thiophene, or a combination thereof, and
   the heteroatom-containing aromatic second repeating unit is different from the conjugated aromatic first repeating unit and is 2,5-thiophene, 2,5-pyridine, 2,6-pyridine, 2,5-furan, 2,5-pyrrole, 6,6'-(2,2'-bipyridine}, or a combination thereof.

10. The method of claim 8, wherein
    the copolymer is poly[(9,9-dioctylfluorenyl-2,7-diyl)-alt-co-(6,6'-{2,2'-bipyridine})].

11. The method of claim 1, wherein
    the heat-treating of the surface-treated substrate is performed at about 60° ° C. to about 200° C.

12. The method of claim 1, wherein
    the contacting the surface-treated substrate with the composition is performed at a coating speed of about 0.1 mm/min to about 50 mm/min.

13. The method of claim 1, wherein
    in the composition, a content of carbon nanotubes surface-coated with a heteroatom-containing aromatic polymer is about 1 g/ml to about 200 g/ml.

14. The method of claim 1, further comprising:
    performing a showering process using a benzene-based solvent after the heat-treating of the surface-treated substrate.

15. A carbon nanotube monolayer film, prepared by the method of claim 1, the carbon nanotube monolayer film comprising:
    a plurality of carbon nanotube composites; and
    a plurality of bifunctional hydrogen-bond linkers,
    wherein each of the carbon nanotube composites includes carbon nanotubes and a heteroatom-containing aromatic polymer coating film on surfaces of the carbon nanotubes, and
    wherein the plurality of carbon nanotube composites are bonded to each other through hydrogen bonds by the bifunctional hydrogen-bond linkers.

16. The carbon nanotube monolayer film of claim 15, wherein
    a density of carbon nanotubes in the carbon nanotube monolayer film is about 60 ea/μm to about 350 ea/μm.

17. The carbon nanotube monolayer film of claim 15, wherein
    an f-factor in the carbon nanotube monolayer film is about 0.4 to about 0.8.

18. The carbon nanotube monolayer film of claim 15, wherein
    the carbon nanotube monolayer film has a thickness of about 0.5 nm to about 10 nm.

* * * * *